United States Patent [19]

Krajewski et al.

[11] Patent Number: 5,098,305
[45] Date of Patent: Mar. 24, 1992

[54] MEMORY METAL ELECTRICAL CONNECTOR

[75] Inventors: Nicholas J. Krajewski; David J. Johnson, both of Chippewa Falls; Arthur O. Kunstmann, Weyerhauser, all of Wis.

[73] Assignee: Cray Research, Inc., Minneapolis, Minn.

[21] Appl. No.: 324,906

[22] Filed: Mar. 17, 1989

Related U.S. Application Data

[63] Continuation-in-part of Ser. No. 53,142, May 21, 1987.

[51] Int. Cl.⁵ .............................................. H01R 9/09
[52] U.S. Cl. ....................................... 439/75; 29/830; 439/161
[58] Field of Search .................. 439/55, 75, 81, 82, 439/161; 29/830; 361/414

[56] References Cited

U.S. PATENT DOCUMENTS

| | | | |
|---|---|---|---|
| 3,217,283 | 11/1965 | Shlesinger, Jr. | 174/68.5 |
| 3,913,444 | 10/1975 | Otte | 85/8.3 |
| 4,126,758 | 11/1978 | Krumme | 174/52 |
| 4,233,731 | 11/1980 | Clabburn et al. | 29/859 |
| 4,365,400 | 12/1982 | Carlomagno | 29/235 |
| 4,446,505 | 5/1984 | Long et al. | 439/75 |
| 4,451,965 | 6/1984 | Carlomagno | 29/450 |
| 4,462,651 | 7/1984 | McGaffigan | 339/30 |
| 4,468,076 | 8/1984 | Hine et al. | 339/75 M |
| 4,505,532 | 3/1985 | Hine et al. | 339/75 M |
| 4,505,767 | 3/1985 | Quin | 148/402 |
| 4,586,969 | 5/1986 | Tamura et al. | 148/402 |
| 4,646,435 | 3/1987 | Grassauer | 29/840 |
| 4,664,309 | 5/1987 | Allen et al. | 228/180.2 |
| 4,665,906 | 5/1987 | Jervis | 128/92 YN |
| 4,687,269 | 8/1987 | Dubertret | 439/161 |
| 4,705,205 | 11/1987 | Allen et al. | 228/180.2 |
| 4,720,270 | 1/1988 | Guenin et al. | 439/161 |
| 4,737,114 | 4/1988 | Yaegashi | 439/82 |
| 4,746,301 | 5/1988 | Key | 439/82 |

FOREIGN PATENT DOCUMENTS

| | | |
|---|---|---|
| 1000108 | 3/1988 | Belgium . |
| 217678 | 4/1987 | European Pat. Off. . |
| 108012 | 9/1978 | Japan . |
| 96755 | 6/1984 | Japan . |
| WO88/09599 | 12/1988 | PCT Int'l Appl. . |
| 487251 | 3/1970 | Switzerland . |
| 2177641 | 2/1988 | United Kingdom . |

OTHER PUBLICATIONS

Patent Abstracts of Japan, vol. 8 No. 213 (E-269) (1650) 28 Sep. 1984, JP-A-59 96755 (Hitachi Seisakusho (K.K.) 04 Jun. 1984.

Patent Abstract of Japan, vol. 7, No. 181 (C-180) (1326) 10 Aug. 1983, JP-A-58 87219 (Nippon Denki K. K.) 25 May 1983.

IBM Technical Disclosure Bulletin, vol. 13, No. 4, Sep. 1970, New York, U.S. p. 106 Ecker et al.: "Expandable Pin for Circuit Board".

Materials Engineering, Oct. 1969, pp. 28–31; Wagner, H. J. et al.: What You Can Do with That "Memory Alloy".

(List continued on next page.)

Primary Examiner—Neil Abrams
Attorney, Agent, or Firm—Merchant, Gould, Smith, Edell, Welter & Schmidt

[57] ABSTRACT

A method and apparatus for interconnecting circuit board assemblies using memory metal wires mechanically inserted into through-plated holes. The invention has its application in the interconnection of stacked circuit board assemblies where kinked memory metal wires are stretched so the wires are substantially straight; inserted into axially aligned through-plated holes of circuit boards; and released so that the memory metal wires reform their original kinked shaped within the through-plated holes, forming an electrical connection between the circuit boards. Memory metal alloys are used in the construction of the kinked memory metal wires to take advantage of the pseudoelastic behavior of the alloys in the austenitic phase below the forming temperature range.

59 Claims, 16 Drawing Sheets

OTHER PUBLICATIONS

Feinwektechnik & Messtechnik, vol. 95, No. 7, Nov. 1987, De pp. 198–204; Stockel, D.: "Anwendungen von Niti-Legierungen mit Formgedachtnis-Effekt".

Articles from *Encyclopedia of Materials-Science and Engineering*, vol. 6, Pergamon Press, Oxford, England, 1986.

Article: "The Shape Memory ('Marmem') Effect in Alloys", Wayman and Shimizu, Metal Science Journal, vol. 6, 1972.

Article: "55-Nitinol Unique Wire Alloy with a Memory", Buehler and Cross, Wire Journal, Jun. 1969.

Article: "Titanium: for when you care enough to use the very best", Chiles, Smithsonian, vol. 18, No. 2.

Brochure: "Tinel Shape-Memory Metal", Raychem Corporation, 1981.

Brochure: "PGA Connector", Raychem Corporation, 1985.

Brochure: "CryoTact DIP Socket", Raychem Corporation, 1984.

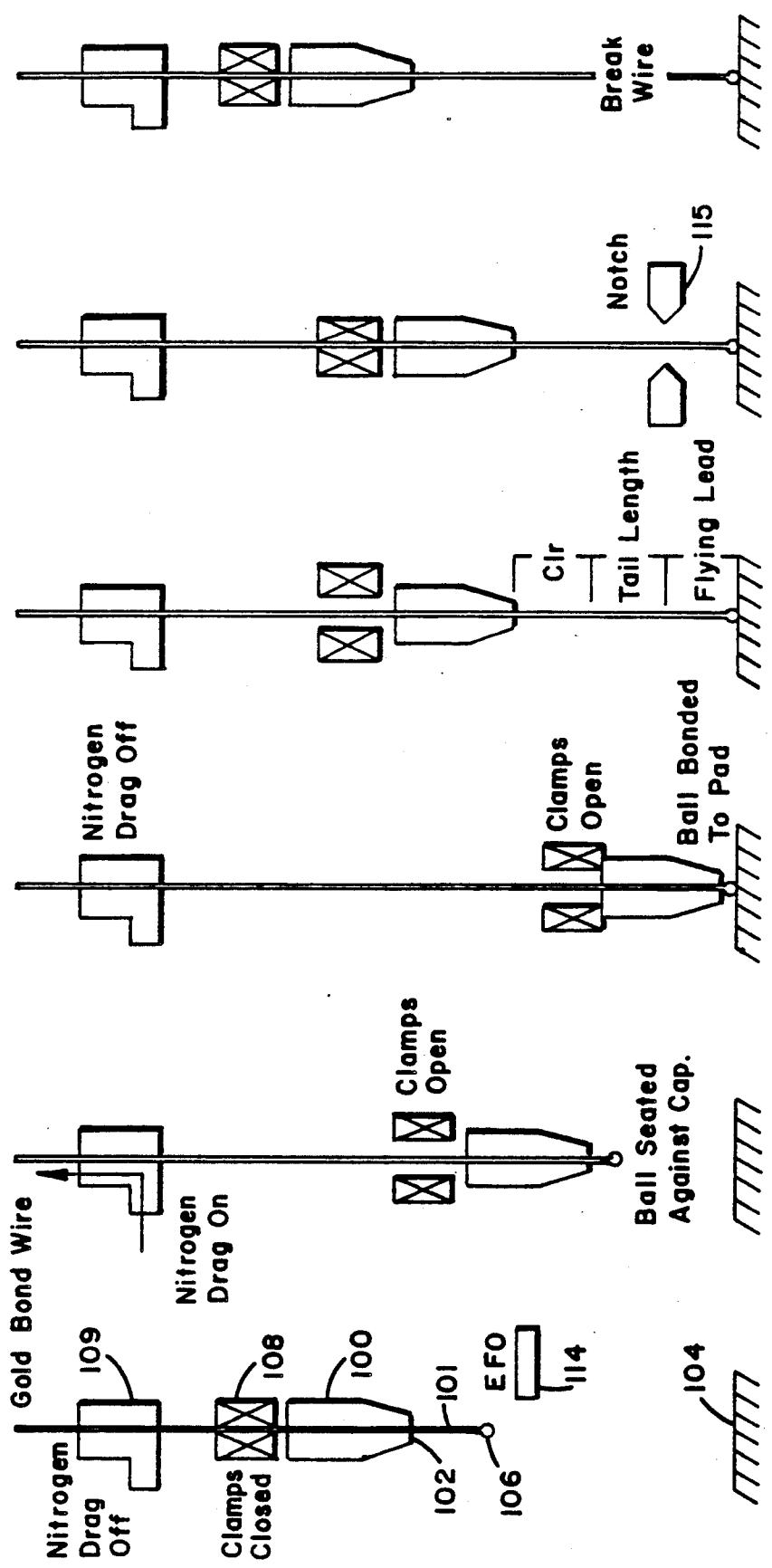

Plated Hole Pattern On Circuit Board

Bonding Pad Pattern On Chip

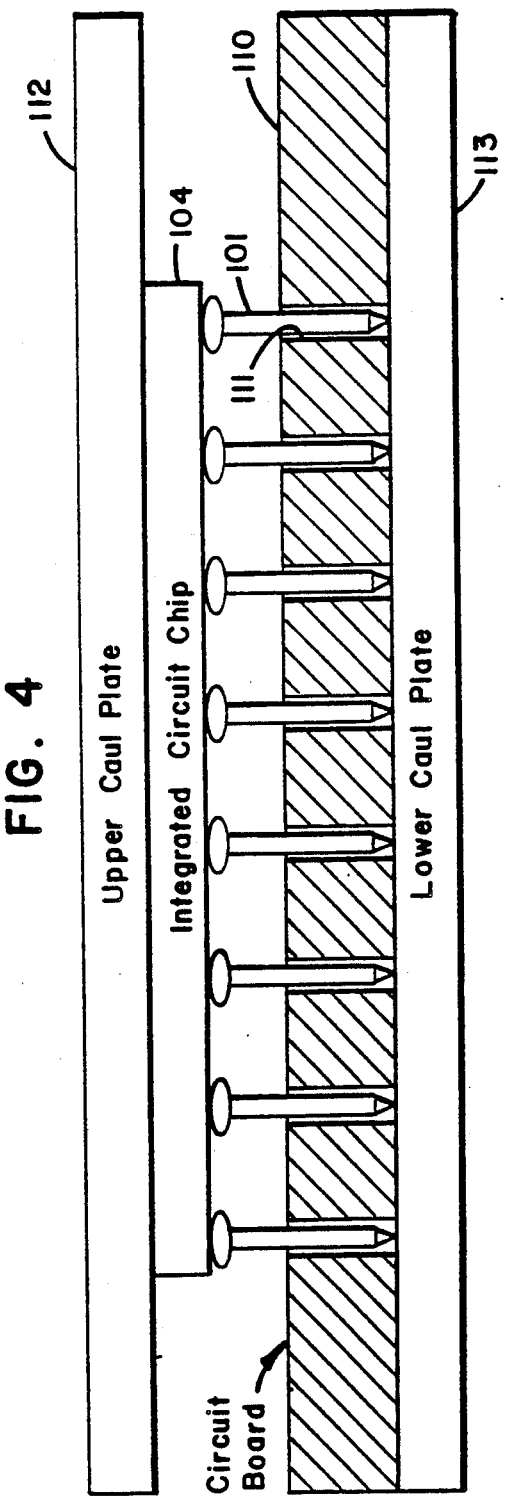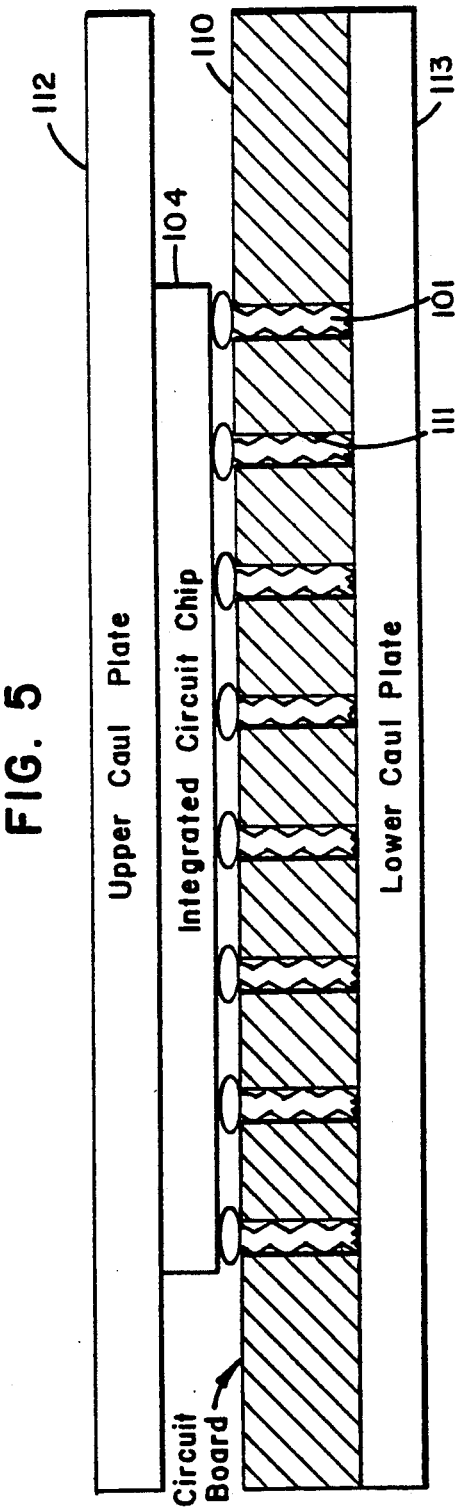

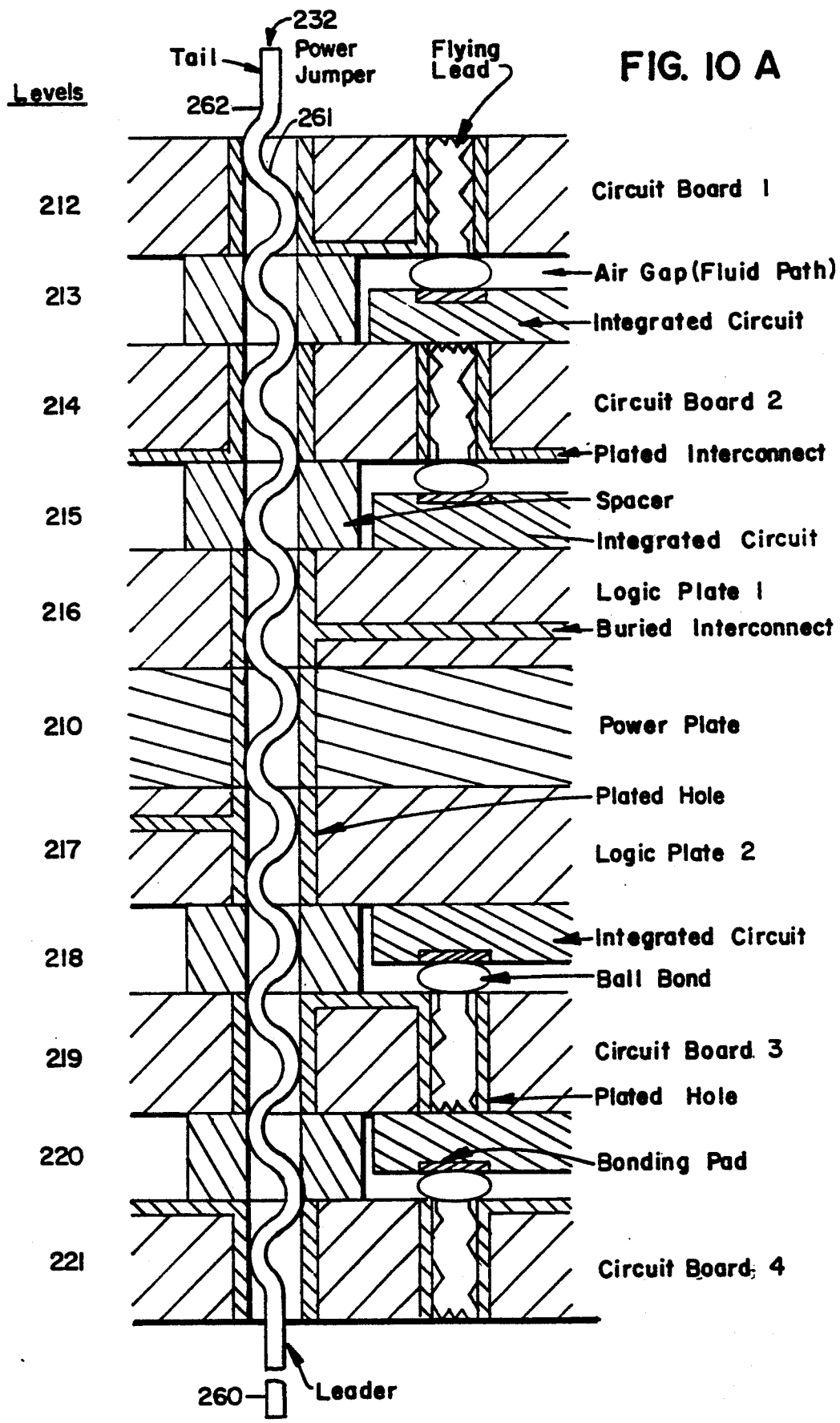

MEMORY METAL ELECTRICAL CONNECTOR

This application is a continuation-in-part of copending patent application Ser. No. 053,142, filed May 21, 1987. This copending application is assigned to the same assignee as the present invention.

TECHNICAL FILED OF THE INVENTION

The present invention relates to the field of electrical circuit interconnect, and more specifically to a new apparatus and method for interconnecting stacks of printed circuit boards.

BACKGROUND OF THE INVENTION

Large electrical devices such as supercomputers of the type manufactured by Cray Research, Inc., the assignee of the present invention, are constructed of a large plurality of integrated circuits. In the prior art, integrated circuits are typically fabricated on wafers which are cut into individual integrated circuit chips and packaged within hermetically sealed ceramic or plastic packages. The signal and power lines from the integrated circuit chips are brought out to the pins of the packages by means of leads attached to the bonding pads on the integrated circuit chips. The chips are then used to form larger circuits by interconnecting the integrated circuit packages by means of a printed circuit (PC) board. The circuit board contains interconnect lines or foils on the surfaces of the circuit boards or within planar layers. The circuit board is populated with integrated circuit packages which are soldered to plated via holes or on surface mounted pads on the circuit board. The soldering process forms an electrical and mechanical connection between the integrated circuit package and the circuit board.

To form larger circuits, circuit boards populated with integrated circuit packages are interconnected by a variety of connectors, wires, or cables. The physical arrangement of the circuit boards in relation to one another is also accomplished in a wide variety of configurations. One popular high-density interconnect technique is to stack the circuit boards in a sandwiched relationship to one another and electrically interconnect the circuit boards with interboard connectors. This packing technique achieves a fair amount of packing density, limited by the interboard spacing requirements of heat dissipation and connector spacing.

The aforementioned technique of forming larger circuits from individual integrated circuits using integrated circuit packages and circuit boards results in limited packing density of the actual area which is used for electrical circuits. The actual integrated circuit chips themselves are typically smaller than one-tenth of a square inch, and in total would cover only 10–20 percent of the board area. However, due to the inefficiencies of packaging of integrated circuit chips and connecting the integrated circuit chips to the circuit boards, it is difficult or impossible to increase the packing density on circuit boards to improve speed or spacing advantages. In addition, interboard spacing is limited by the area consumed by the integrated circuit packages and inter-board connects. This limited packing density limits the inter-circuit signal speed due to the long propagation delays along the long interconnect lines.

SUMMARY OF THE INVENTION

The present invention provides a new apparatus and method for high-density signal and power interconnections between circuit boards which uses "memory metal" jumper wires to overcome the wasted space and speed disadvantages of the prior art. The present invention provides for z-axis interconnection of sandwiched circuit boards in the x-y plane by using memory metal wires connected through the axially-aligned through-plated holes of the circuit boards. As used herein, memory metal wire refers to a wire comprised of certain metallic alloys in which a kinked metal wire is given its kinked shape in the austenitic phase above the forming temperature. The memory metal wire is maintained in use in the austenitic phase below the forming temperature but above the martensitic transformation temperature.

In use, the memory metal wire is straightened when stressed and reforms to its kinked shape when the stress is removed in the austenitic phase. To those skilled in the art, this unusual behavior is called the shape-memory effect. Shape-memory behavior is connected with thermoelastic martensitic transformation. The preferred embodiment of the present invention uses the pseudoelastic behavior of the memory metal alloys in the austenitic phase. As stress increases along the length of the kinked wire, the wire straightens out as long as the stress does not plastically deform the wire. When the stress is removed, the kinked shape is recovered. The shape memory behavior is found in a variety of alloys such as Ni-Ti, Ag-Zn, Au-Cd, Au-Cu-Zn, Cu-Al, Cu-Al-Ni, Cu-Au-Zn, Cu-Sn, Cu-Zn, Cu-Zn-Al, Cu-Zn-Ga, Cu-Zn-Si, Cu-Zn-Sn, Fe-Pt, In-Tl, Ni-Al, Ni-Ti, Ni-Ti-X (where X is a ternary element), Ti-Co-Ni, Ti-Cu-Ni and others. In the preferred embodiment, nickel-titanium (Nitinol) alloys are used with the specific composition of the alloys selected so that the transition temperature remains well below the ambient operating temperature of the electronic assembly.

In a preferred embodiment of the present invention, a substantially straight or non-kinked leader section of the kinked memory metal wire comprising nickel-titanium alloy is inserted through axially aligned plated holes of two or more circuit boards in a substantially perpendicular direction (z-axis) to the planar surface (x-y axes) of the boards. The leader section of the memory metal wire is selected to be slightly longer than the distance through the axially aligned holes such that a portion of the leader wire protrudes through one side of the sandwich of circuit boards. The protruding leader section is gripped and the tail of the memory wire is pulled until the kinked portion of the memory metal wire is substantially straightened. The leader portion is then used to maintain tension on the memory metal wire as the straightened kinked portion of the wire is positioned in the plated holes of the circuit boards. The tension on the memory metal wire is then released causing the memory metal to reform its original kinked shape within the plated holes, and to form strong mechanical and electrical connection between the circuit boards.

In an alternate preferred embodiment, the leader section of the memory metal wire is inserted through the axially-aligned plated holes of the circuit boards. The leader section is then gripped and pulled substantially perpendicular to the planer surfaces of the board to drag the kinked portion of the memory metal wire into position. This alternate means of inserting the kinked memory metal wires is acceptable if damage to the plating on the axially-aligned holes is minimized.

In an alternate preferred embodiment, the temperature of the kinked memory metal wire is lowered below the transition temperature to place the alloy of the wire into the martensitic phase. The wire is then longitudinally stressed substantially straight. While in the martensitic phase, the wire will remain substantially straight after the stress is removed. The wire is then inserted into the axially aligned holes of a plurality of circuit boards. The wire is then warmed or allowed to warm above the transition temperature so that the alloy of the wire enters the austenitic phase. Above the transition temperature, the memory metal wire reestablishes its original kinked shape to effect electrical connection between the circuit boards.

When inserting a plurality of kinked memory metal wires through a stack of circuit boards, it is important to alternate the positioning or rotation of the wires to ensure that the lateral pressure on the plated holes of a particular circuit board is not substantially in one lateral direction due to the additive effects of a plurality of kinked memory metal wires pressing on the inner surfaces of the plated holes in a generally similar direction. This could cause forced misalignment of the circuit boards. By alternating the position or rotation of the kinked memory metal wires on a stack of circuit boards, the net lateral pressure on the individual circuit boards sums in such a fashion as to cancel the individual lateral components of pressure of each kinked pin.

The kinked memory metal wires are selected to maintain an average of two contact points per plated through hole per circuit board. Alternate shapes of the kinked memory metal wires maybe used to ensure this minimum average of contacts per hole is maintained.

BRIEF DESCRIPTION OF THE DRAWINGS

In the drawings, where like numerals identify like components throughout the several views.

FIGS. 2A-2F show the steps to construct a flying lead on an integrated circuit die.

FIG. 4 shows the relative positions of the integrated circuit chip and the circuit board prior to compression of the flying leads into the plated holes.

FIG. 5 shows the relative positions of the integrated circuit chip and the circuit board after the flying leads having been compressed inside the plated holes of the circuit board.

DETAILED DESCRIPTION OF THE PREFERRED EMBODIMENT

In the following detailed description of the preferred embodiments, reference is made to the accompanying drawings which form a part hereof, and in which is shown by way of illustration, specific embodiments in which the invention may be practiced. These embodiments are described in sufficient detail to enable those skilled in the art to practice the invention and it is to be understood that other embodiments may be utilized and that structural, mechanical, or metallurgical changes may be made without departing from the spirit and scope of the present invention. The following detailed description is therefore, not to be taken in a limiting sense and the scope of the present invention is defined by the appended claims.

The preferred embodiment of the present invention relates to the high-density packing of circuit boards in a sandwiched arrangement. The application of this technology is designed for speed improvements, improved heat dissipation, and improved packing density required for modern supercomputers such as the Cray-3 manufactured by the assignee of the present invention.

In the preferred embodiment of this application, the integrated circuit chips are attached to the circuit board by flying gold leads, as discussed below and disclosed in copending patent application Ser. No. 07/053,142 which is assigned to the same assignee of the present invention and which is incorporated herein by reference. The placing of integrated circuit chips directly onto the circuit boards eliminates the bulky packages normally used to contain integrated circuit chips. By removing the chips from the packages and placing them directly on the circuit boards the integrated chips can be surrounded by liquid coolant to improve cooling and allow circuit boards to be more closely placed thereby reducing inter-board propagation delay of signals. Improved cooling techniques are extremely important when using gallium arsenide (GaAs) integrated circuit chips due to the high power and high heat dissipation requirements of these chips as described in copending patent application Ser. No. 07/104,758 which is assigned to the same assignee of the present invention and which is incorporated herein by reference.

Flying Lead Construction

Figure 1:
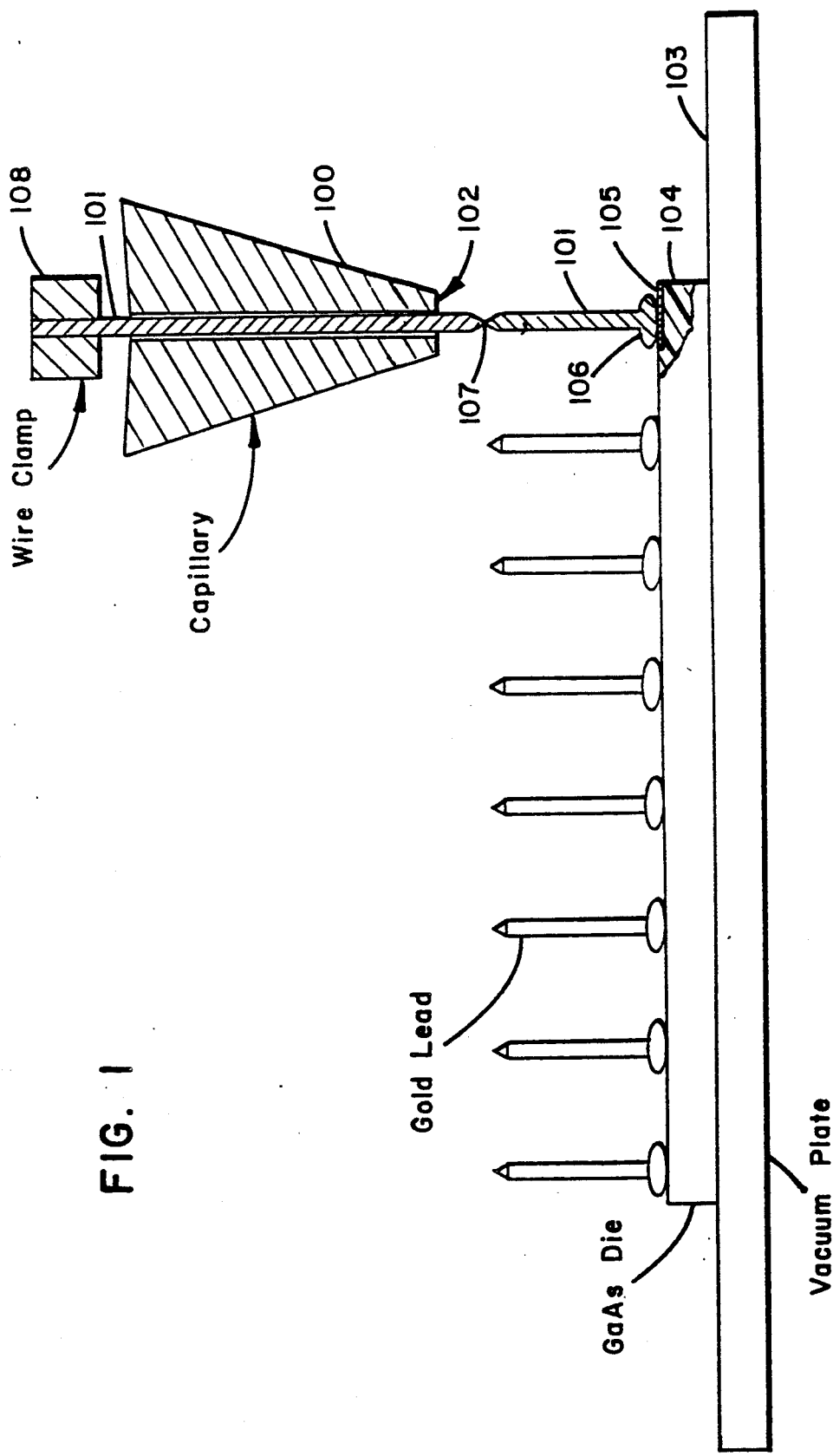
FIG. 1 is a side view of an integrated circuit die onto which flying gold leads, are ball bonded and straightened by a modified ball bonding machine.

FIG. 1 shows the preferred embodiment for attaching flying gold leads to a silicon or gallium arsenide (GaAs) chip or die before attaching the die to the circuit board. The leads are made of a malleable conductive material such as soft gold wire which is approximately 3 mils in diameter. Those skilled in the art will readily recognize that hard gold or other metals may be used. The GaAs chips used in the preferred embodiment contain 52 bonding pads which have a sputtered soft gold finish. The objective of the die bonding operation is to form a gold-to-gold bond between the wire and the pad. A Hughes automatic thermosonic (gold wire) ball bonding machine Model 2460-II is modified to perform this operation. The unmodified ball bonding machine is available from Hughes Aircraft Company, of Carlsbad, Calif. This machine was designed and normally used to make pad-to-lead frame connections to IC packages and has been modified to perform the steps of flying lead bonding as described below. The modifications include hardware and software changes to allow feeding, flaming off, bonding and breaking heavy gauge gold bonding wire (up to 0.0030 inch diameter gold wire).

The Hughes automatic ball bonding machine has an X-Y positioning bed which is used to position the die for bonding. The die is loaded on the bed in a heated vacuum fixture which holds up to 16 dice. The Hughes bonding machine is equipped with a vision system which can recognize the die patterns without human intervention and position each bonding pad for processing. An angular correction as well as an X-Y position is available to the machine.

The soft gold wire that is used for the flying leads in the preferred embodiment is sometimes referred to as sticky gold or tacky gold. This gold bonding wire is formed from a 99.99% high-purity annealed gold. The process of annealing the high-purity gold results in a high elongation (20-25% stabilized and annealed), low tensile strength (3.0 mil, 50 gr. min.) gold wire which is dead soft. The wire composition (99.99% pure Au non-Beryllium doped) is as follows:

| Gold | 99.990% min. |
| Beryllium | 0.002% max. |
| Copper | 0.004% max. |
| Other Impurities (each) | 0.003% max. |
| Total All Impurities | 0.010% max. |

This type of gold is available from Hydrostatics (HTX grade) or equivalent. Those skilled in the art will readily recognize that flying leads of the type described here may be constructed from a wide variety of malleable conductive materials.

Referring to FIG. 1, the flying lead die bonding procedure begins with the forming of a soft gold ball at the tip of the gold wire. The wire is fed from a supply spool (not shown) through a nitrogen-filled tube 109 (shown in FIGS. 2A-2F) to a ceramic capillary 100. The inside of the capillary is just slightly larger than the wire diameter. The nitrogen in the connecting tube 109 can be driven either toward the capillary or away from the capillary toward the supply spool. This allows the gold wire to be fed or withdrawn from the capillary tip.

The gold ball 106 formed at the end of the gold wire 101 is thermosonically bonded to bonding pad 105 of chip 104. The capillary tip 102 of capillary 100 is capable of heating the ball bond to 300° C. concurrent with pressing the ball 106 onto the pad 105 and sonically vibrating the connection until a strong electrical and mechanical connection is formed. The capillary 100 is then withdrawn from the surface of the die 104 and the wire 101 is extruded from the tip 102. A notching mechanism, added to the Hughes ball bonder to perform the specific notching operation described herein, is used to make a notch 107 at the appropriate height of the flying lead to break the connection and to stiffen the lead. Wire clamp 108 grasps the gold wire 101 and the capillary is withdrawn upward, breaking the flying lead at 107 and concurrently performing a nondestructive test of the ball bond to bonding pad connection.

The sequence of steps required to make a flying lead bond to the package die is shown in FIGS. 2A-2F. Step 1 begins with the feeding of a predetermined amount of wire through the capillary 100. A mechanical arm then positions an electrode 114 below the capillary tip 102 and a high-voltage electrical current forms an arc which melts the wire and forms a gold ball with a diameter of approximately 6 mils. This is termed electrostatic flame-off (EFO). Specified ball size range is attainable through EFO power supply output adjustment up to 10 milliamps. During this step, the clamps 108 are closed and the nitrogen drag is off. This action occurs above the surface of the integrated circuit chips so as to avoid any damage to the chip during the EFO ball forming process.

In step 2, the nitrogen drag 109 withdraws the supply wire 101 into the capillary 100 and tightens the ball against the capillary tip 102.

The capillary tip 102 is heated to 200° C. (range of ambient to 300° C.) to assist in keeping the gold wire 101 in a malleable state. The die fixture is also heated to 200° C. (range of ambient to 300° C.) to avoid wire cooling during the bonding process. The die fixture is made of Teflon-coated aluminum. As shown in FIG. 1, a vacuum cavity or vacuum plate 103 holds the die 104 in position on the fixture during the bonding process.

In step 3, the bonding machine lowers the capillary 100 to the surface of a bonding pad 105 and applies high pressure (range of 30-250 grams) to the trapped gold ball 106 along with ultrasonic vibration at the capillary tip 102. The capillary tip 102 is flat, with a 4-mil inside diameter and an 8-mil outside diameter. The ball 106 is flattened to about a 3-mil height and a 6-mil diameter. Ultrasound is driven through the ceramic capillary 100 to vibrate the gold ball 106 and scrub the bonding pad surface. The sound is oriented so that the gold ball 106 moves parallel to the die surface. The Hughes ball bonding machine has the ability to vary the touch-down velocity, i.e., soft touch-down for bonding GaAs, which is program selectable. The ultrasonic application is also program selectable.

In step 4, the capillary 100 is withdrawn from the die surface 104, extending the gold wire 101 as the head is raised. The nitrogen drag is left off and the capillary is raised to a height to allow enough gold wire to form the flying lead, a tail length for the next flying lead, and a small amount of clearance between the tail length and the capillary tip 102. The Hughes ball bonder device is capable of selecting the height that the capillary tip can move up to a height of approximately 0.750 inch.

In step 5, an automatic notching mechanism 115 moves into the area of the extended gold wire 101 and strikes both sides of the wire with steel blades. This is essentially a scissor action which cuts most of the way through the gold wire 101, forming a notch 107. The notch 107 is made 27 mils above the surface of the die. The notching mechanism has been added to the Hughes ball bonder for the precise termination of the flying leads. The Hughes ball bonder has been modified to measure and display the notch mechanism height. The activation signal for the notch mechanism is provided by the Hughes ball bonder system for the proper activation during the sequence of ball bonding. The flying lead length is adjustable from between 0.0 mils to 50.0 mils. It will be appreciated by those skilled in the art that the notching function can be accomplished with a variety of mechanisms such the scissor mechanism disclosed above, a hammer-anvil system, and a variety of other mechanisms that merely notch or completely sever the wire 101.

In step 6, clamp 108 closes on the gold wire 101 above the capillary 100 and the head is withdrawn until the gold wire breaks at the notched point. This stretching process serves several useful purposes. Primarily, the gold wire is straightened by the stretching force and stands perpendicular to the die surface. The stretching produces a work-hardened lead. In addition, the bond is nondestructively pull-tested for adhesion at the bonding pad. The lead 101 is terminated at a 27-mil height above the die surface 104 in the preferred embodiment. At the end of step 6, the capillary head for the bonding mechanism is positioned over a new bonding pad and the process of steps 1–6 begin again. The bonding wire 101 is partially retracted into the capillary once again, and the clamps are closed, as shown in step 1, so that a new ball may be formed by the EFO.

The die positions are roughly determined by the loading positions in the vacuum fixture. The Hughes automatic bonding machine is able to adjust the X-Y table for proper bonding position of the individual die. An angular correction is automatically made to adjust for tolerance in placing the die in the vacuum fixture. This is done through a vision system which recognizes the die pad configurations. Using the modified Hughes automatic bonding machine with the current bonding technique, a minimum bonding rate of 2 die pads per second is possible.

Circuit Board Construction

Figure 3B:
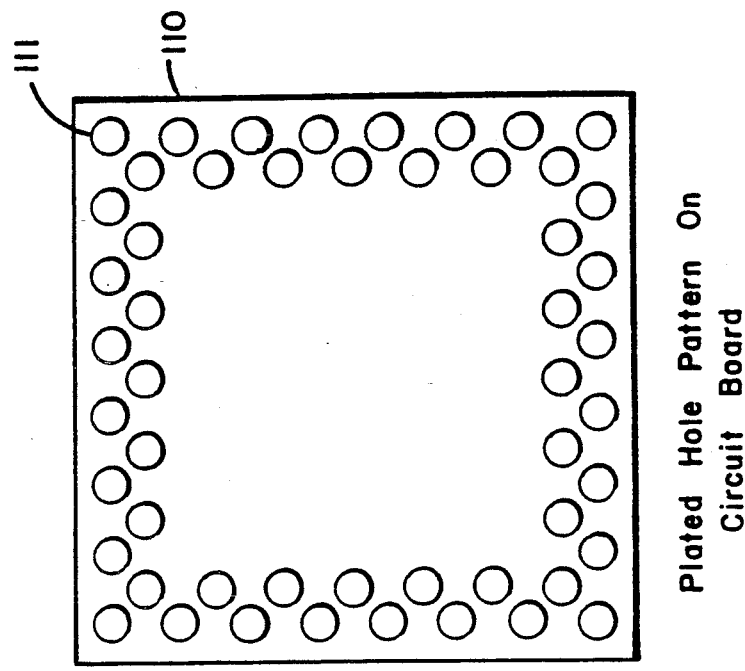
FIGS. 3A and 3B each show the bonding pad pattern on a typical integrated circuit along with the corresponding plated hole pattern on a circuit board which mates the integrated circuit chip to the circuit board.
Figure 3A:
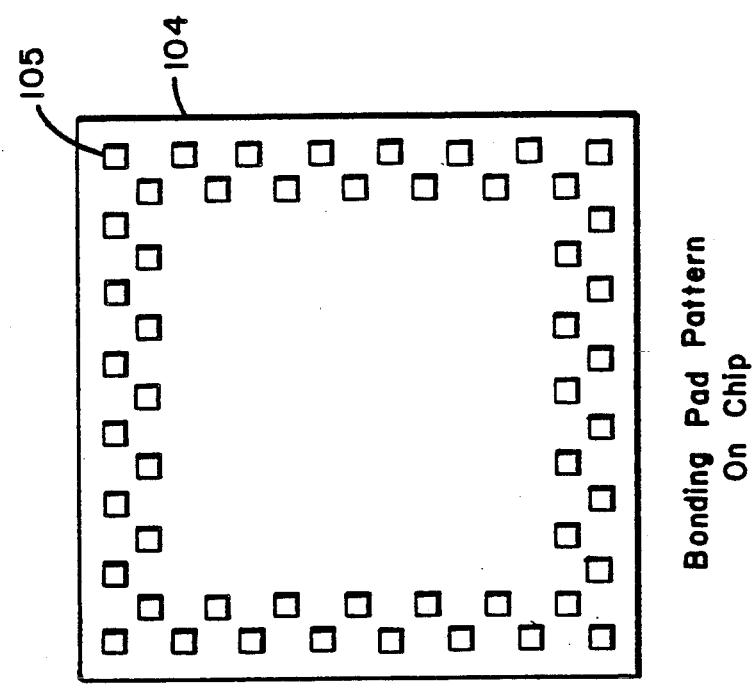

Once the gold bonding leads are attached to the integrated circuit chip or die, the die is ready to be attached to the circuit board. As shown in FIG. 3, the bonding pattern of the integrated circuit die 104 matches the plated hole pattern on the circuit board 110. For example, the top view of integrated circuit die 104 in FIG. 3 shows the bonding pad 105 in the upper right corner.

The circuit board 110 shown in FIG. 3 shows a corresponding plated hole 111 which is aligned to receive the bonding lead from bonding pad 105 when circuit board 110 is placed over integrated circuit 104 and the flying leads are inserted into the hole pattern on the circuit board. Thus, each bonding pad of integrated circuit 104 has a corresponding plated hole on circuit board 110 aligned to receive the flying leads.

The circuit board assembly operation begins with the die insertion in the circuit board. The circuit board is held in a vacuum fixture during the insertion process. This is to make sure that the board remains flat. Insertion can be done by hand under a binocular microscope or production assembly can be done with a pick-and-place machine. An alternative method of inserting the flying leads into the plated holes of circuit boards is to lay the integrated circuits on a flat surface with the flying leads pointed upwards. The circuit board may then be dropped over the integrated circuit die so that the flying leads pass through the plated holes and protrude from the opposite side of the circuit board.

Figure 4A:
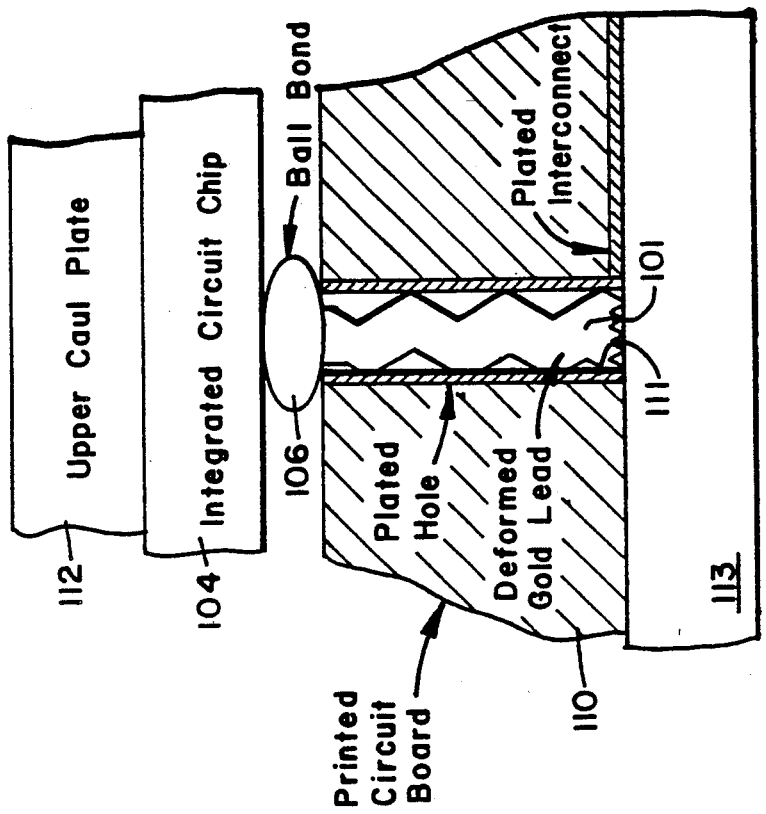
FIG. 4a is a closeup view of a single ball-bonded flying lead prior to compression within the plated hole of the circuit board.

Referring to FIG. 4, the circuit board 110 with the loosely placed die 104 is shown mounted on an aluminum vacuum caul plate (lower caul plate) 113. Steel guide pins (not shown) are placed in corner holes of the circuit board to prevent board motion during the assembly operation. A second (upper) caul plate 112 is then placed on the top side of the circuit board populated with chips to press against the tops (non-pad side) of the chips 104. The sandwich assembly comprising the circuit board, the chip and the caul plates is then placed in a press and pressure is applied to buckle and expand the gold leads 101 in the plated holes 111 of the circuit board.

Figure 5A:
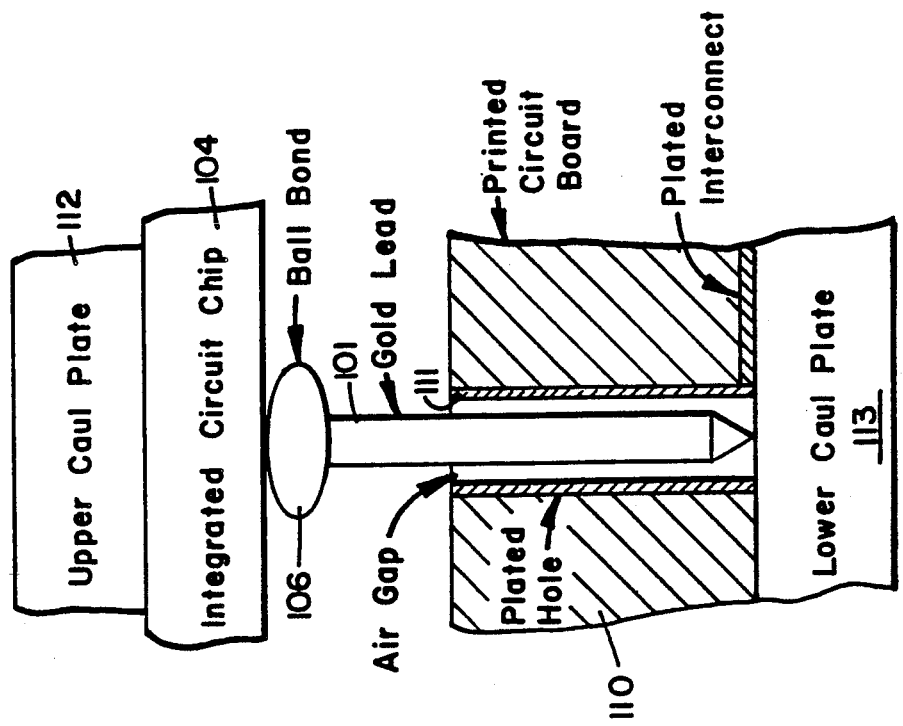
FIG. 5a is a closeup view of a ball-bonded flying lead that has been compressed into a plated hole on the circuit board.

The side view of the sandwiched circuit board 110, integrated circuit chip 104, and caul plates 112 and 113 in FIGS. 4 and 5 illustrates the position of the gold leads 101 before and after the pressing operation, respectively. In the preferred embodiment there is a 9.2-mil exposure of gold lead 101 of a total lead length of 29 mil which upon compression will buckle and expand into the plated hole 111 of the circuit board 110. The 3-mil diameter wire 101 in a 5-mil diameter hole 111 means the initial fill is 36 percent of the available volume. After pressing, the fill has increased to 57 percent as a result of the 9.2-mil shortening of the gold lead 101. As shown in greater detail in FIGS. 5 and 5a, the lead typically buckles in two or more places, and these corners are driven into the sides of the plated hole 111 of the circuit board. The assembly is completed in one pressing operation. The circuit board 110 can now be removed from the press with the integrated circuit chip 104 securely attached and electrically bonded to the plated holes of the circuit board.

Figure 6:
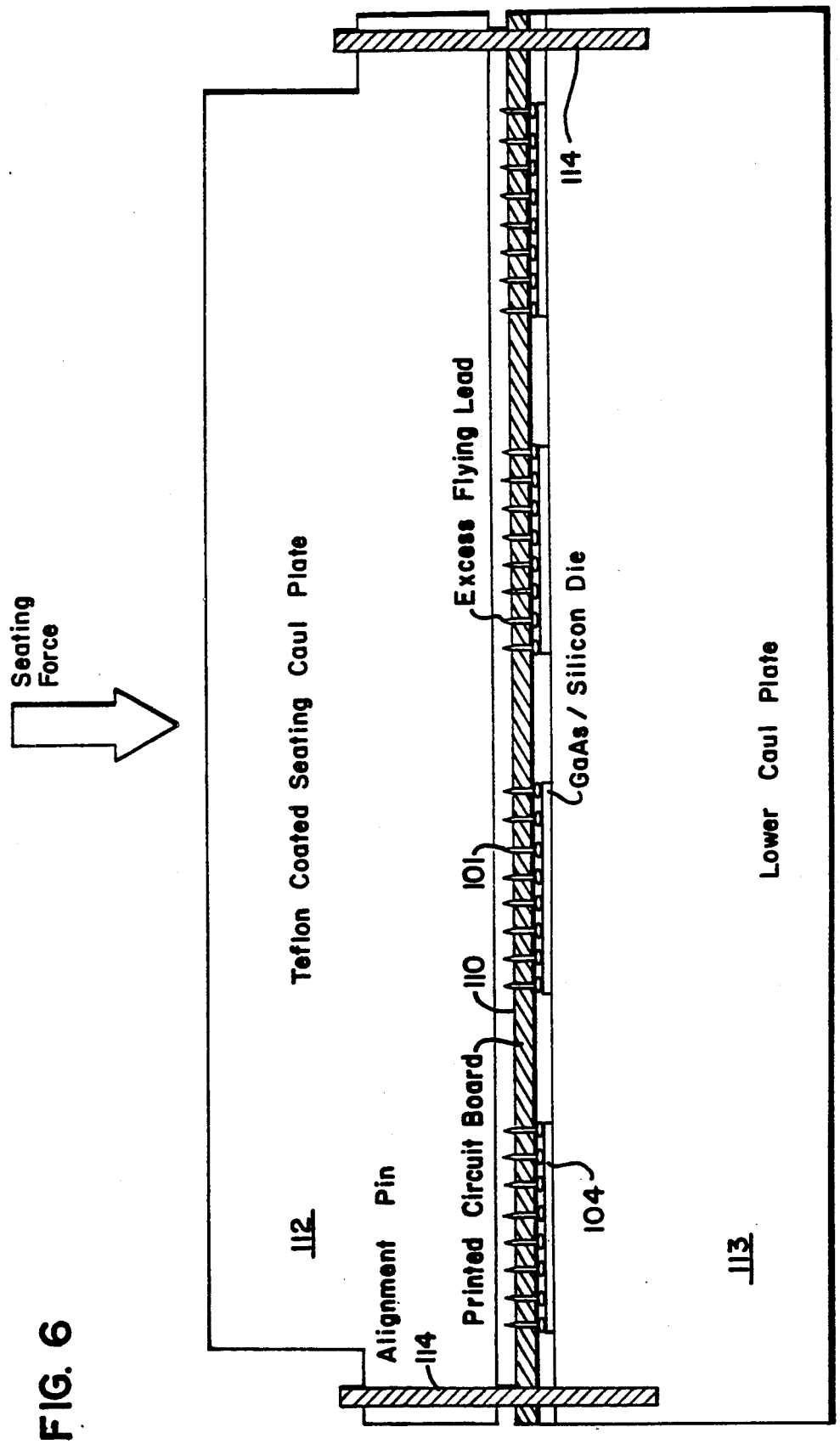
FIG. 6 is a larger view of the compression process whereby a plurality of integrated circuit chips having flying leads are attached to a single printed circuit board through the application of seating force on caul plates which sandwich the circuit board/chip combination.

FIG. 6 shows a broader view of an alternate circuit board press which may be used to attach the integrated circuits to the printed circuit board. The upper caul plate 112 is a seating caul plate which is aligned through alignment pins 114 with the circuit board 110 and the lower caul plate 113 which is a die fixture plate to hold the dice during the pressing process. The alignment pins 114 are used to prevent the printed circuit board 110 from sliding or otherwise moving during the pressing process. A seating force is applied to the top of upper caul plate 112 which forces the excess flying lead material down into the plated holes of printed circuit board 110. Thus, integrated circuits 104 are mechanically and electrically bonded to printed circuit board 110. It will be appreciated by those skilled in the art that many variations of the above-described pressing operation can be used which results in the same or equivalent connection of the flying leads to the PC boards.

Those skilled in the art will readily recognize that other methods may be used for directly attaching integrated circuit dice to the surfaces of printed circuit boards without the need of packaging the integrated circuit chips. For example, the chips may be tab bonded to the surface of the PC boards in either a flip chip (inverted) fashion or with the active portion of the integrated circuit facing away from the circuit board. In a similar fashion, the integrated circuit chips may be placed on the circuit face-down with conductive bumps positioned on the circuit board to align with the bonding pads of the integrated circuit to effect the electrical connection. Thus, alternate methods for attaching unpackaged integrated circuit chips to PC boards may be used to assist in the cooling low profile construction of the populated PC boards.

Module Assembly Construction

A sandwiched assembly of printed circuit boards populated with integrated circuit chips is interconnected in the z-axis direction using memory metal wires. In the preferred embodiment of the present invention (as described more fully below), a leader portion of a kinked-shaped memory metal wire is inserted through the stack assembly of circuit boards and gripped on the other side. Tension is then placed on the memory metal jumper wire until it is stretched so that it is substantially straightened. The straightened wire is then positioned so that the part of the wire formally kinked is placed through axially aligned plated holes between layered circuit boards. The wire is then released so that it reforms its kinked shape and forms an electrical connection substantially perpendicular to the planar surfaces of the printed circuit boards.

The memory metal wire refers to a wire comprised of certain metallic alloys in which a kinked metal wire is given its kinked shape in the austenitic phase above the forming temperature. When used as an electrical connector, the memory metal wire is maintained in the austenitic phase below the forming temperature but above the martensitic transformation temperature. The memory metal wire may be plated with a better electrical conductor such as gold plated over a copper strike.

In use, the memory metal wire is straightened when stressed and reforms to its kinked shape when the stress is removed in the austenitic phase. To those skilled in the art, this unusual behavior is called the shape-memory effect. Shape-memory behavior is connected with thermoelastic martensitic transformation. The preferred embodiment of the present invention uses the pseudo-elastic behavior of the memory metal alloys in the austenitic phase. As stress increases along the length of the kinked wire, the wire straightens out as long as the stress does not plastically deform the wire. When the stress is removed, the kinked shape is recovered. The shape memory behavior is found in a variety of alloys such as Ag-Zn, Au-Cd, Au-Cu-Zn, Cu-Al, Cu-Al-Ni, Cu-Au-Zn, Cu-Sn, Cu-Zn, Cu-Zn-Al, Cu-Zn-Ga, Cu-Zn-Si, Cu-Zn-Sn, Fe-Pt, In-Tl, Ni-Al, Ni-Ti, Ni-Ti-X (where X is a ternary element), Ti-Co-Ni, Ti-Cu-Ni and others. In the preferred embodiment, nickel titanium (Nitinol) alloys are used with the specific composition of the alloys selected so that the transition temperature remains well below the ambient operating temperature of the electronic assembly.

Figure 7:
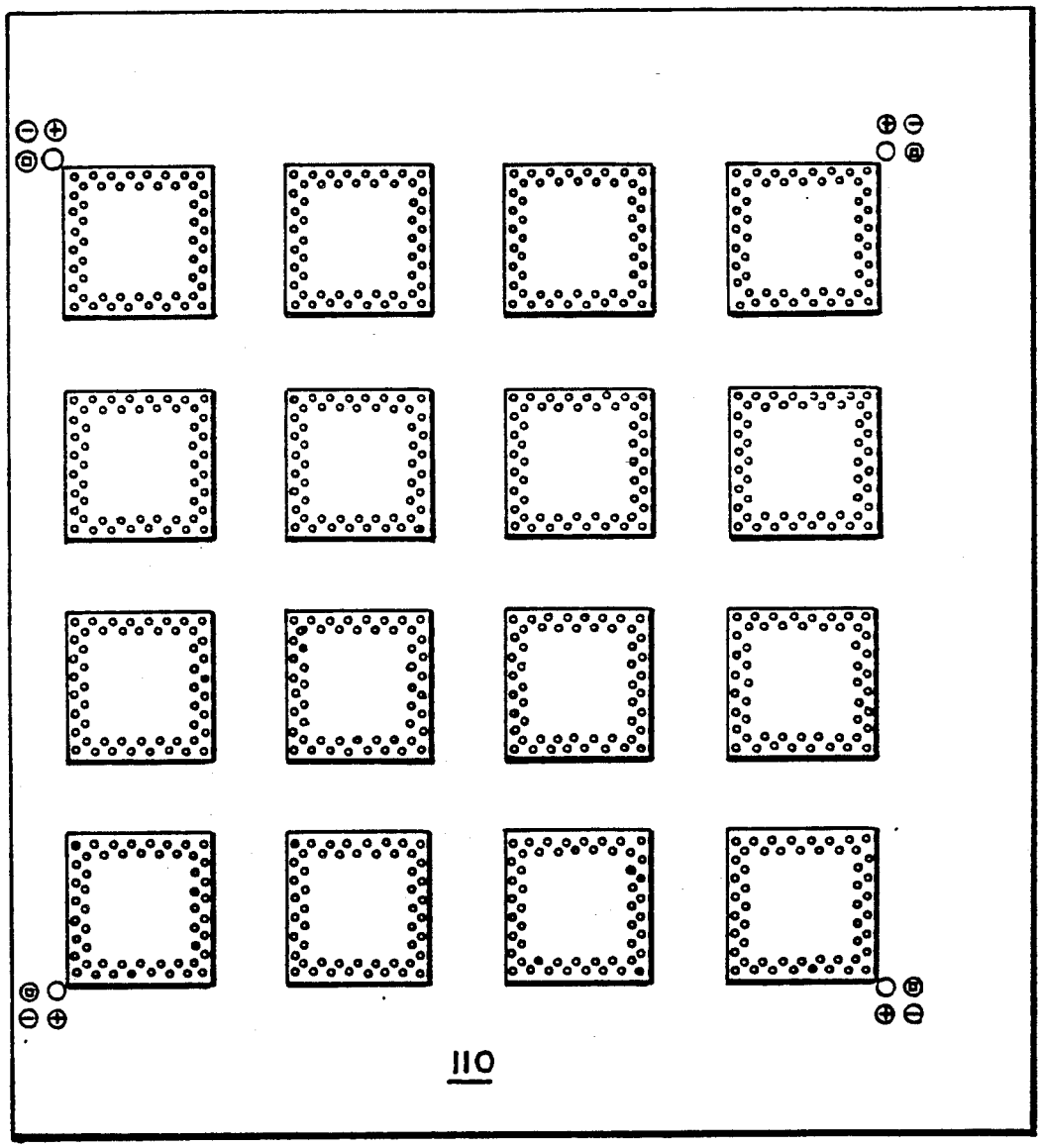
FIG. 7 is a greatly enlarged view of a plated hole pattern for a typical PC board onto which integrated circuit dice are attached.

FIG. 7 is an example of a printed circuit board hole pattern for the type of circuit boards used in the Cray-3 supercomputer manufactured by the assignee of the present invention. In the preferred embodiment of the present invention, each circuit board provides sixteen plated hole patterns for the acceptance of sixteen integrated circuits having flying leads. The sixteen integrated circuits are attached to each of the circuit boards of the type found in FIG. 7 through the pressing process previously described for circuit board assembly or by using alternate TAB bounding or bump bonding. Caul plates of a size slightly larger than the circuit boards of the type shown in FIG. 7 are used during the pressing process to attach the integrated circuit chips to the circuit boards. Each plated hole pattern on circuit board 110 of FIG. 7 corresponds to the hole pattern disclosed in FIG. 3. Each corner of circuit board 110 includes four plated via holes which are used to distribute power and are used for alignment during the pressing operation.

Figure 8:
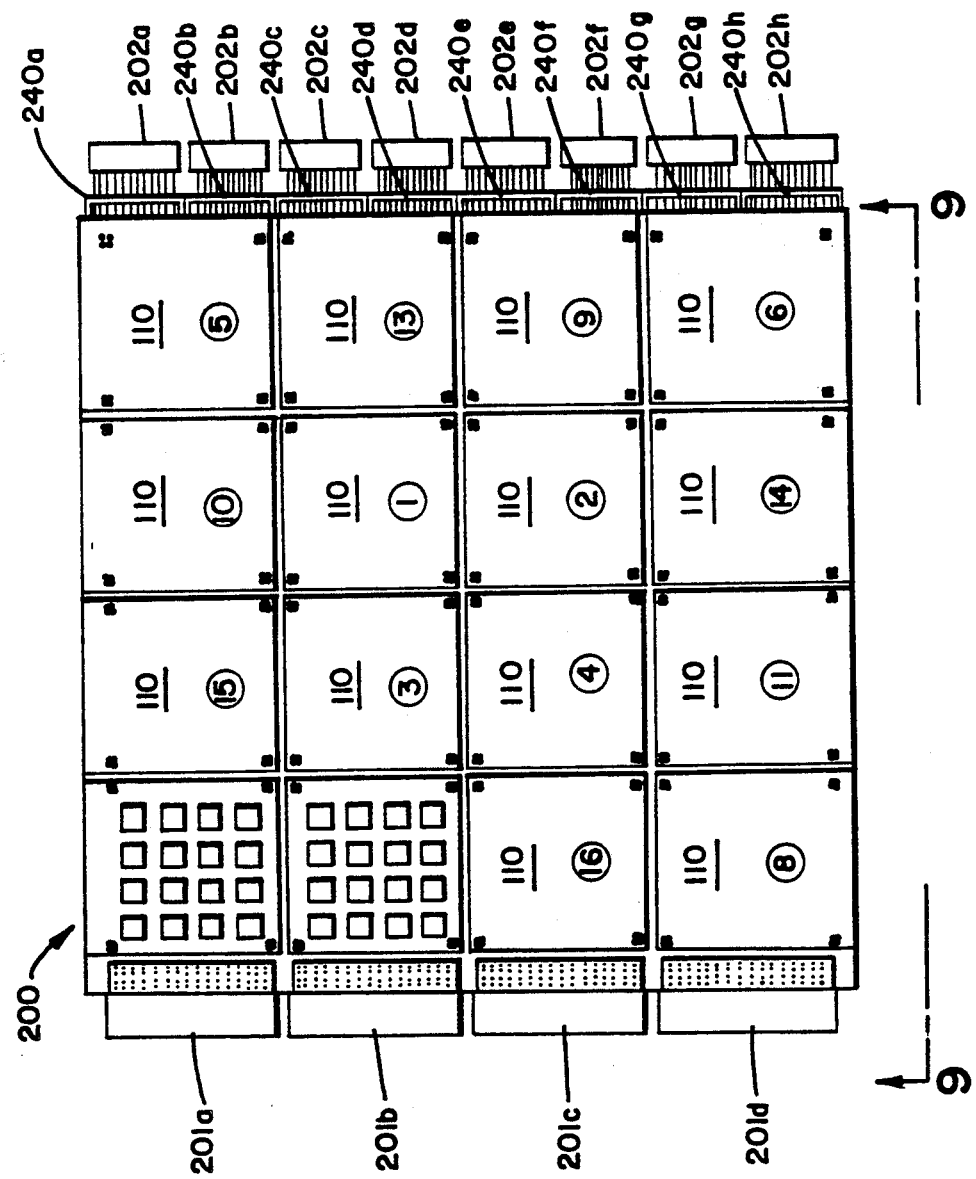
FIG. 8 is a module assembly onto which a plurality of circuit boards populated with integrated circuit chips are attached.

In the preferred embodiment of the present invention, sixteen of the circuit boards 110 shown in FIG. 7 are arranged in a module assembly 200 of the type shown in FIG. 8. The circuit boards 110 are arranged in a 4×4 matrix on each level of the module. There are four levels of the module in which circuit boards are stacked, thus created an X-Y-Z matrix of 4×4×4 circuit boards. This results in 64 circuit boards for each module assembly 200 which in turn results in 1,024 integrated circuit chips per module assembly.

A top view of a module assembly is shown in FIG. 8. The module assembly is 4.76 inches wide, 4.22 inches long, and 0.196 inch thick, nominal. At one edge of the module assembly are four power blades 201a–201d. These machined metal blades are both the mechanical connection to the cabinet into which the module assemblies are placed and the electrical connection to the power supplies. At an opposite edge of the module assembly are eight signal edge connectors 202a–202h. These connectors form the communication paths to the other module assemblies within the machine. The bundles of wires between the circuit boards of the module assembly 200 and the board edge connectors 202a–202h are provided with strain relief members 240a–240h respectively. Each strain relief is a plastic member which protrudes from the edge of the circuit boards. The interconnected wires pass through holes in the strain relief members between the circuit boards and the floating connectors 202a–202h. In this fashion, the flexing of the wires during the connection and disconnection of connectors 202a–202h does not strain the soldered connection of the wires to the circuit boards. The strain relief members 240a–240h also serve as spacers between the circuit boards in a fashion similar to spacers 203 described below.

Electrical communication between the integrated circuit chips of each board 110 is accomplished by means of the prefabricated foil patterns on the surface and buried within each circuit board. The electrical communication between circuit boards 110 in the X-Y plane is by means of memory metal jumpers along the Z-axis (perpendicular to the planar surface of the circuit boards and the module assembly) effecting electrical connection between the circuit boards 110, two logic plates sandwiched in the center of the module assembly and a centrally located power distribution board sandwiched between the logic plates. The z-axis memory metal jumper wires may be used for electrical communication signals and for power distribution. The Z-axis jumpers may be placed in any of the area on circuit boards 110 that is not occupied by an integrated circuit. In the preferred embodiment of the assembly module, anywhere from 200-1000 z-axis logic jumpers may be used for a single circuit board stack. 6400-11,000 jumpers may be used for a module 200.

Figure 9:
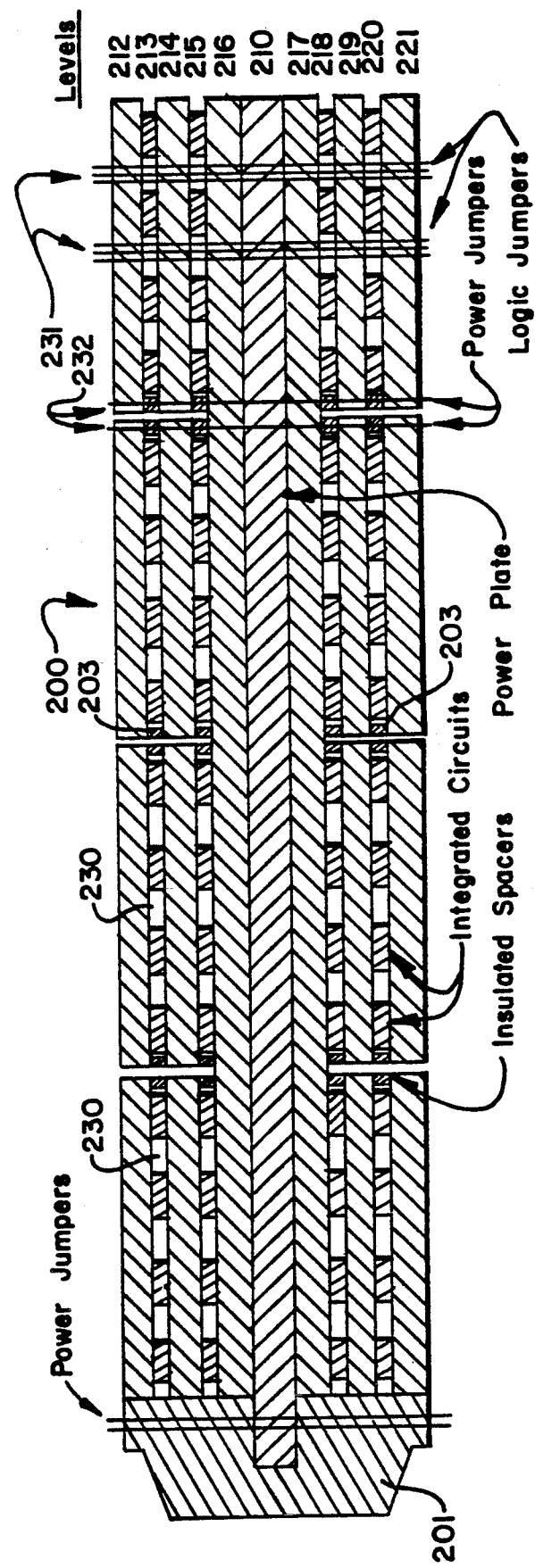
FIG. 9 is a side view of the module assembly of FIG. 8 showing the details of the logic jumpers and power jumpers for signal and power interconnection between the sandwich assembly of printed circuit boards.

FIG. 9 shows a side sectional view of a module assembly. The assembly 200 is constructed as a sandwich comprising four layers of circuit boards, two layers of logic plates (circuit board interconnect layers), and one layer of power distribution. FIG. 9 depicts a completely assembled module assembly with the exception of the single edge connectors and strain-relief members, which have been omitted for purposes of this discussion. The assembly 200 in application is stacked with other assemblies in a fluid cooling tank and positioned so that the planar surface of the module assembly is stacked in a vertical direction. Thus, in application, the view of the circuit board assembly 200 of FIG. 9 is actually a topdown look at the module in application. A type of cooling apparatus suitable for cooling the circuit board module assemblies of the present invention is described in U.S. Pat. No. 4,590,538 assigned to the assignee of the present invention and incorporated herein by reference.

Cooling channels 230 are provided between the circuit boards of the module assembly to allow the vertical rise of cooling fluid through the module assembly to remove the excess heat produced by the integrated circuits in operation. Heat transfer occurs between the chips of circuit boards 1 through 4 (levels 212, 214, 219, 221, respectively) and the fluid passing through channels 230 over the chips. There is also heat transfer from the chips to the circuit boards to the logic jumpers 231 to the passing fluid surrounding the module. The former is the primary heat transfer vehicle from the chips of the circuit boards. Position between logic plates 216 and 217 is the power plate 210 for the distribution of power to the various circuit boards. The cooling channels 230 between the circuit boards and surrounding the integrated circuit chips are created by spacing the circuit boards from one another in a spaced relationship using corner spacers aligned in the corners of the circuit boards with power jumpers 232. The power jumpers serve the dual purpose of distributing power from power plate 210 and in maintaining the position of the circuit boards in relation to one another by holding the corner spacers 203 in place. At the module edge, the strain reliefs 240a-240h also serve as board spacers.

The module assembly 200 as shown in FIG. 9 depicts one of the four power blades 201 shown to the left. The power plate shown as layer 210 is a power distribution plate or circuit board which connects to the four power blades and is used to distribute electrical power throughout the module for powering the integrated circuits. The connection between the integrated circuits on the circuit boards and the power plates is by Z-axis memory metal power jumpers 232 which are described in more detail below.

As described above, each module assembly consists of sixteen board stacks. Each board stack consists of four circuit boards. The side edge view of the module assembly shown in FIG. 9 shows four board stacks exposed in a cutaway view. The four circuit board levels are labeled Nos. 212, 214, 219 and 221. Electrical communication between these boards is through two logic plates labeled 216 and 217. These plates are in the center of the module assembly sandwiching the power plate 210 and dividing the board stacks in half. Communication between circuit boards 212, 214, 219 and 221 and logic plates 216 and 217 is via memory metal jumpers or logic jumpers 231 in the Z-axis direction (relative to the X-Y axes lying on the planar surface of the circuit boards and logic plates). The logic plates as well as the circuit boards contain electrical interconnecting plated wiring patterns in the X-Y direction, and the Z-direction interconnect is thus performed by the logic jumpers.

The integrated circuits 104 are shown in FIG. 9 as rectangles at levels 213, 215, 218 and 220. The flying leads from these integrated circuits 104 are attached to circuit boards 212, 214, 219 and 221, respectively. Thus, circuit board 212 with integrated circuits 104 is assumed to have been previously assembled with the aforementioned flying lead attachment of integrated circuits to circuit boards or one of several alternative attachment techniques. The spaces between the integrated circuits at levels 213, 215, 218 and 220 are coolant flow paths which also allow the memory metal logic jumpers 231 to pass through the levels of the module. Spacers are also found between the circuit boards at levels 212, 214, 219 and 221 positioned at the corners of the circuit boards to maintain the circuit boards in a spaced relationship to one another. The remaining areas between the circuit board layers allows the free flow of coolant and allows the unobstructed passage of power and logic jumpers.

The memory metal logic jumper wires 231 and the memory metal power jumper wires 232 are inserted, stretched and, positioned through the board stack before relaxation to interconnect all of the axially aligned through-plated holes on the circuit boards (levels 212, 214, 219, 221), the power plates (level 210) and the logic plates (levels 216, 217). The memory metal logic jumpers 231 and the memory metal power jumpers 232 are made in the preferred embodiment of the present invention of a nickel-titanium alloy. The memory metal jumpers are released within the axially aligned plated holes to form electrical connections in the Z-axis direction. Jumpers 231 in FIG. 9 are similar to the power jumpers 232 also shown in FIG. 9 except for size and diameter. The power jumpers 232 may be larger than the logic jumpers 231 to connect to power plates 210 and 223 to supply power to the circuit boards.

Figure 10:
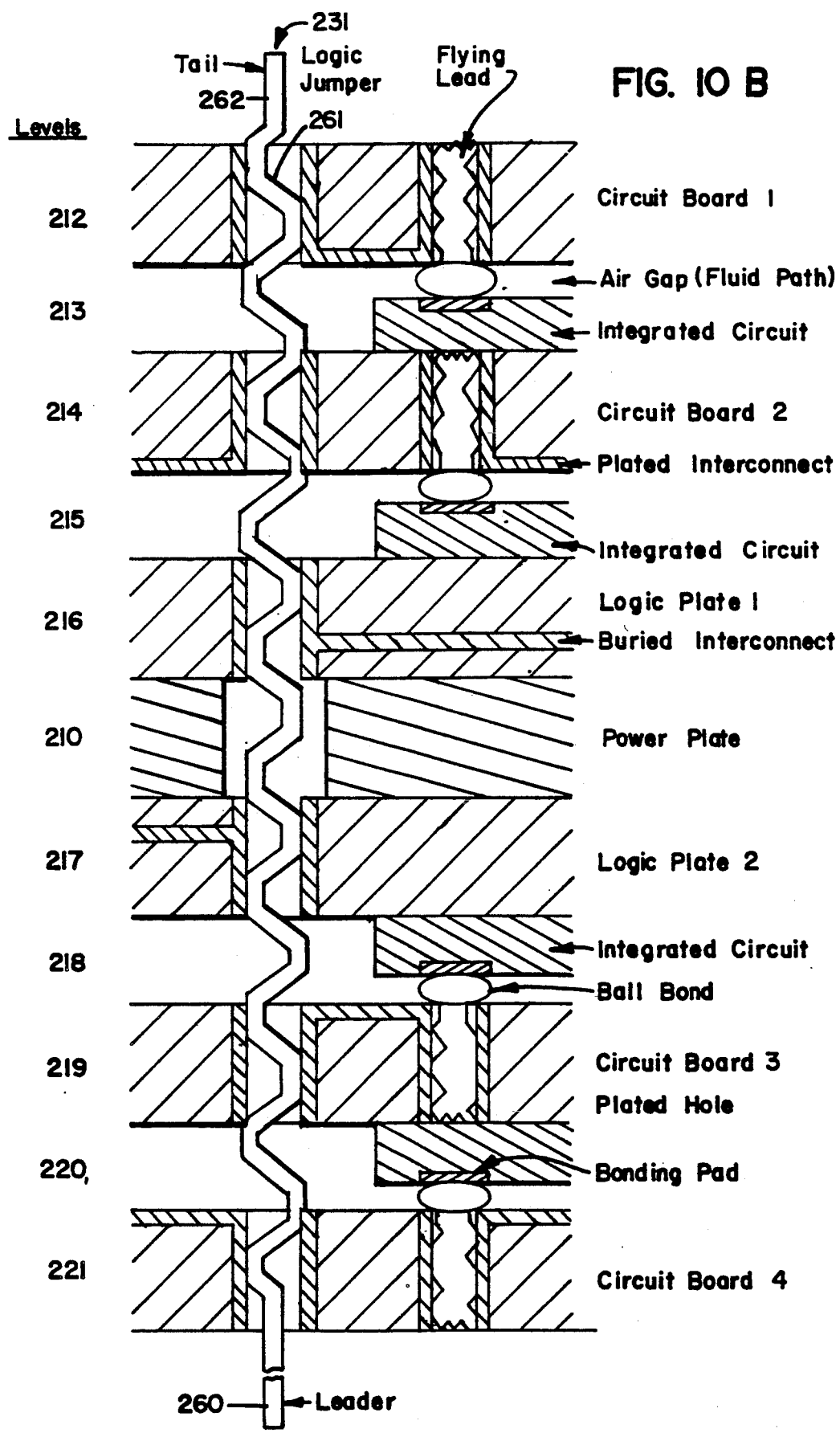
FIG. 10A is an enlarged cross-sectional view of a single logic jumper of a preferred shape which has been placed within the axially-aligned plated holes of the sandwiched printed circuit boards of the module assembly of FIG. 9.
FIG. 10B is an enlarged cross-sectional of a single logic jumper of an alternate preferred shape which has been placed within the axially-aligned plated holes of the sandwiched printed circuit boards of the module assembly of FIG. 9.
FIG. 10C is an enlarged cross-sectional of a single logic jumper of an alternate preferred shape showing the conformance of the memory metal jumper wire to the misaligned holes of a printed circuit board stack thus compensating for out-of-tolerance alignments of the poorly axially aligned plated holes.
Figure 10:
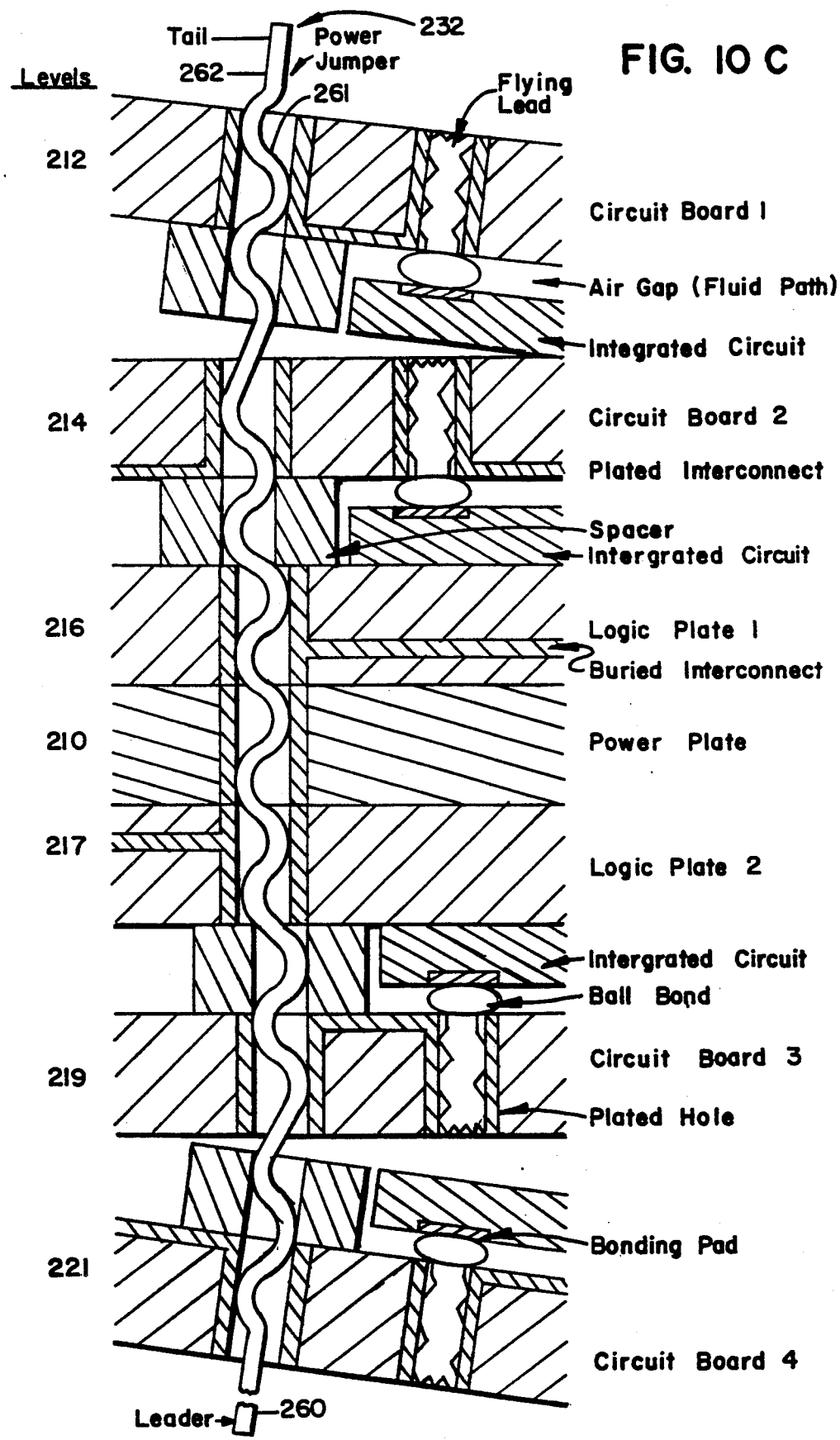

FIG. 10A shows a closeup view of a single power jumper 232 of a preferred sinusoidal shape inserted through the various levels of assembly 200. This cross-sectional view of FIG. 10A is not drawn to scale and is offered as a schematic illustration of how the memory metal wires are inserted within the plated hole of the circuit boards, power plates and logic plates. Corner spacers are used at levels 213, 215, 218 and 220 to maintain the circuit boards in a spaced relationship. Buried plated interconnect or surface interconnect on circuit boards and logic plates form the interconnection between the power jumpers and the plated holes for the flying leads of integrated circuits. Logical or electrical communication between integrated circuits and the board edge connectors is achieved therefrom. It will be appreciated by those skilled in the art that logic jumpers will appear similar to the power jumpers shown in FIG. 10A, except that the power jumpers electrically connect to plated holes on the power plate 210 of the assembly 200 and are somewhat larger in diameter.

FIG. 10B shows a closeup view of a single logic jumper 231 of a second preferred shape inserted through the various levels of assembly 200. This cross-sectional view of FIG. 10B is not drawn to scale and is offered as schematic illustration of the memory metal wires inserted within the plated holes of the circuit boards, power plates, and logic plates. In a particular shape shown in FIG. 10B an average of two contacts per plated hole of each circuit board is accomplished with a minimum of one contact providing the necessary electrical and mechanical bonding between circuit boards. Logic jumpers 231 do not contact the power plate, and a clearance hole is provided in the power plate to ensure non-contact.

FIG. 10C is similar to the closeup side sectional views of FIGS. 10A and 10B except that the misalignment of circuit boards is exaggerated in the X, Y and Z planes to illustrate the compensatory qualities of the memory metal jumper wire when used as a z-axis interconnect between stacked circuit board assemblies. At the dimensions described above, it is difficult to provide for exact alignment of the axially-aligned through-plated holes of each individual circuit board. At best, a tolerance range is effected in which the plated through holes axially-align within a tolerance of plus or minus 0.8 mils. In addition, the circuit boards and circuit boards spacers do not always provide for perfect parallel alignment of the circuit boards resulting in cocked or warped misalignment of the parallel boards. These out-of-tolerance alignments of the circuit boards at hole dimensions of 5.8 mils diameter result in difficult maintenance of electrical connectivity along the z-axis. The memory metal jumper wires are extremely tolerant of this misalignment due to their pseudoelastic property. Misalignment or out-of-tolerance alignment of as much as plus or minus 0.8 mils is compensated for the misalignment by the jumper wires.

The extreme miniaturization of the circuit board assembly of the present invention results in out-of-alignment dimensions which do not shrink in proportion to the circuit board miniaturization. Thus, pin misalignment actually rises as a percent of the dimensions of the circuit boards as miniaturization is increased. The z-axis jumper must have a high degree of compliance to compensate for the increasing percent out-of-tolerance. In addition, the jumper wires in the z-axis direction provide for mechanical holding of the circuit boards together to maintain the module without the need for fasteners. The memory metal jumpers also contribute to the heat dissipation within the module and provide thermal paths for heat conduction away from the circuit boards and into the fluid channels. Those skilled in the art will readily recognize that nickel-titanium alloys used in the preferred embodiment of the present invention have poor electrical conductivity. This poor conductivity may be corrected by providing an outer plating such as a gold plating on a copper strike to provide the necessary high conductivity required for low impedance z-axis electrical connections.

The core material of nickel titanium offers a pseudoelastic material properties which offers the required pin elasticity and compliance to absorb the positional tolerances and misalignments of the circuit boards. The high normal forces in a lateral direction due to the pseudoelastic properties ensures good mechanical and electrical performance of the wire. In addition, the low mass of the nickel titanium alloys for the jumper pins provides for a z-axis jumper wire which is less susceptible to shock and vibration which could cause intermittent connections. Due to the aforementioned fluid emersion cooling techniques, the volume of coolant forced through the coolant passages and around the circuit boards results in an unavoidable vibration due to the pumping action and fluid currents through the module. This continual vibration due to the pumping could result in loosening of a less pseudoelastic material or a higher mass material.

In an alternate embodiment of the z-axis jumpers, a plurality of stands of Nitinol alloy could be used to accomplish the z-axis jumper wire. By combining a plurality of strands such that the kinked portions are positioned in all directions, a higher normal force may be achieved in random directions on the walls of the thorough plated holes of the individual circuit boards. The overall dimensions of the leader potion of the stranded kink memory metal jumper would still need to be to less than inside diameter than the through plated holes to allow for proper insertion of the pins.

Memory Metal Jumper Construction

In copending patent application Ser. No. 07/053,142, filed May 21, 1987 (which is assigned to the same assignee as the present invention), there is described a gold post jumper interconnection apparatus and method and which is incorporated herein by reference. In the gold post jumper method, a stack of printed circuit boards is interconnected using a technique similar to that used in bonding the integrated circuit chips to the circuit boards. As is more fully described in the copending application, small diameter gold wires are inserted through axially aligned plated holes between layered circuit boards and are compressed using caul plates to partially fill the plated holes with the gold wires to form on electrical connection substantially perpendicular to the planar surfaces of the printed circuit boards. The present application discloses an analogous method and apparatus of interconnections which uses memory metal wires for module assembly and interconnection instead of gold posts.

In the preferred embodiment of the present invention, the modules 200 are interconnected using memory metal jumper wires. The memory metal wire that is used for the jumpers in a preferred embodiment of the present invention is a nickel-titanium alloy which is sometimes referred to as Nitinol. Preferably, the nickel titanium alloy wire will have the following parameters:

| Mechanical Properties: | |
| --- | --- |
| Ultimate Tensile Strength | 125,000 psi |
| Fatigue Stress | 70 KSI $\times$ 10$^7$ Cycles |
| Hardness | 89 $R_B$ |
| Poisson's Ratio | .33 |
| Material Design Stress | 20,000 psi |
| % Strain | 8% max design |
| Coefficient of Thermal Expansion: | |
| Austenite | 11.0 $\times$ 10$^{-6}$/°C. |
| Martensite | 6.6 $\times$ 10$^{-6}$/°C. |
| Electrical Resistivity: | |
| Austenite | 100 $\times$ 10$^{-6}$ $\Omega$-cm |
| Martensite | 80 $\times$ 10$^{-6}$ $\Omega$-cm |

This type of nickel-titanium alloy memory metal is available from Raychem under the brand name "Tinel" alloy designation BB. Although in the preferred embodiment of the present invention, specific characteristics of the Nitinol alloy have been described, those skilled in the art will readily recognize that wide variety of nickel titanium alloys could be used with various properties depending upon the particular application of the memory metal jumper wires used in z-axis interconnect of printed circuit boards. Those skilled in the art will readily recognize that the metallic qualities of nitinol are varied extensively by the addition of third metals and by varying the relative percent composition of nickel and titanium to achieve the desired metallic qualities such as hardness, and transition temperature. Various alloys and compositions may be used to construct the preferred embodiment of the present invention as long the wire is given its kinked shape in the austenitic phase above the forming temperature and the forming temperature is well above the operating temperature of the electronic assembly. In addition, the transition temperature of the memory metal wire must be selected to be below the operating temperature of the electronic assembly so that the memory wire is maintained in the austenitic phase below the forming temperature but above the martensitic transformation temperature.

Although in the preferred embodiment of the present invention, Nitinol alloys are described as the best mode of practicing the invention, those skilled in the art will also readily recognize that a wide variety of shape memory metals having superelastic qualities could be substituted therefore. Types of shape memory metal alloys include but are not limited to Ag-Zn, Au-Cd, Au-Cu-Zn, Cu-Al, Cu-Al-Ni, Cu-Au-Zn, Cu-Sn, Cu-Zn, Cu-Zn-Al, Cu-Zn-Ga, Cu-Zn-Si, Cu-Zn-Sn, Fe-Pt, In-Tl, Ni-Al, Ni-Ti, Ni-Ti-X (where X is a ternary element), Ti-Co-Ni, Ti-Cu-Ni and others.

In prototyping the memory metal jumpers for design investigation, the inventors of the present invention fashioned large scale logic jumpers having a kinked portion out of non-martensitic beryllium-copper alloys. It was observed that the non-martensitic BeCu alloys exhibit sufficient lateral stresses on plated through holes when used as a z-axis jumper connector as long as the kinked portion of the jumper is not plastically deformed beyond a certain point. Non-memory metals such as non-martensitic BeCu alloys, however, tend to plastically deform under continued stress and hence have been found unsuitable for logic jumpers or power jumpers or power jumpers in the preferred embodiment of the present invention in long term applications since they tend to plastically deform over time.

Figure 11:
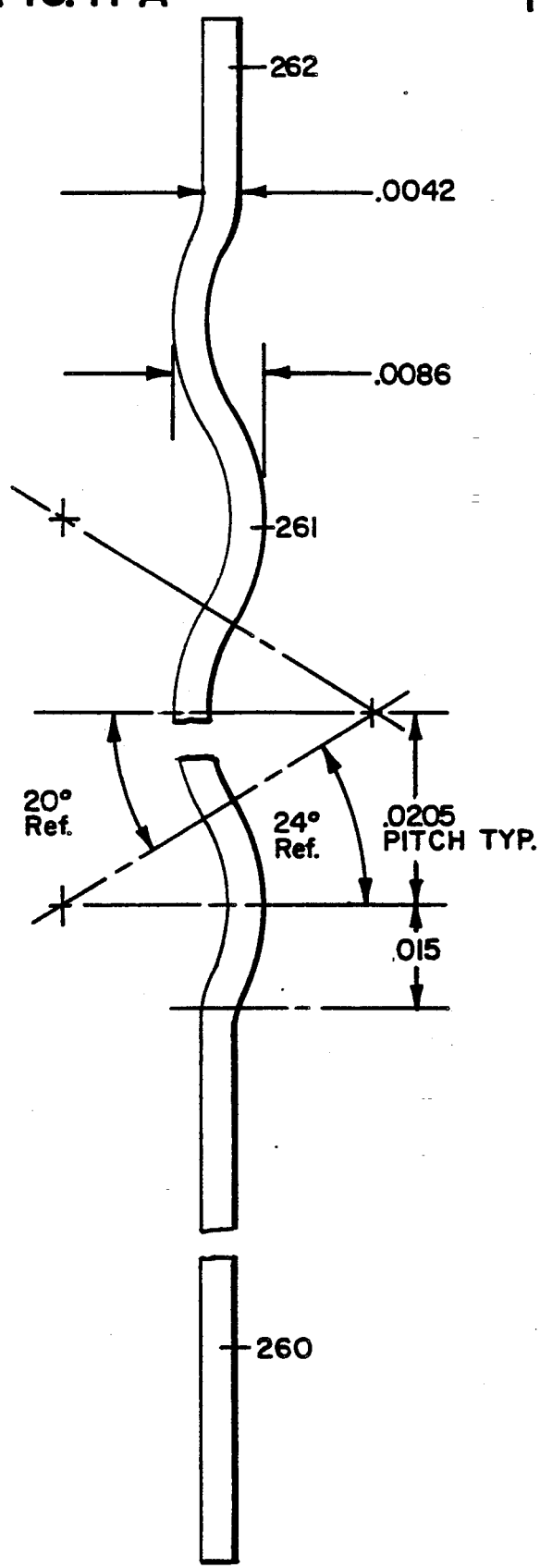
FIG. 11A shows a preferred shape of a memory metal wire.
FIG. 11B shows an alternate preferred shape of a memory metal wire.
Figure 11:

FIGS. 11A and 11B shown alternate preferred shapes of the memory metal jumpers of the preferred embodiment of the present invention. FIG. 11 A shows a detailed view of a shape memory metal wire having a sinusoidal kinked portion which is used for the interconnection of through-plated holes on stacked circuit board assemblies. In the preferred embodiment of the present invention, the shape memory metal wires have a nominal diameter of 4.2 mils while the inside diameter of the plated through holes of the circuit board assemblies is nominally 5.8 mils. The unstrained pitch of the sinusoidal shaped memory metal jumper of FIG. 11A is 8.6 mils maximum. A 0.0205-inch pitch is typical for interconnecting circuit boards having a nominal width of 16 mils. The nominal circuit board pitch is 31.8 mils center-to-center, and the smaller 0.0205 pin pitch is used to obtain an average of two contact points per board level. The circuit board assembly is approximately 0.196 inch thick when stacked with four circuit boards populated by integrated circuit die, two logic plates and a single center power plate. Thus, the kinked portion of the memory metal pin is typically 0.246 inch with leader and tail portions of substantially straight dimensions on either end on the kinked portion.

In an alternate preferred shape of the memory metal z-axis jumper wire, FIG. 11B shows kinked portions of the logic or power memory metal jumper having more squared corners. The dimensions of the memory metal jumper of FIG. 11B are substantially similar to those of FIG. 11A. Those skilled in the art will readily recognize the required modifications to the dimensions shape and pitch of the memory metal jumpers of the preferred embodiment of the present invention which would be required to match the memory jumpers to the application of stacked circuit boards of alternate dimensions. The pins may be manufactured according to the teachings of the present invention as individual jumpers having a short tail section, a long leader section and a central kinked portion. In an alternate usage, the shape memory metal wire may be produced as a continuous string of jumper wires provided on a spool in which the memory metal wire is alternately presented as leader sections or kinked sections. In this fashion, the bulk material may be cut to the desired lengths from the spool for use in automated insertion equipment.

Memory Metal Jumper Installation

Figure 12:
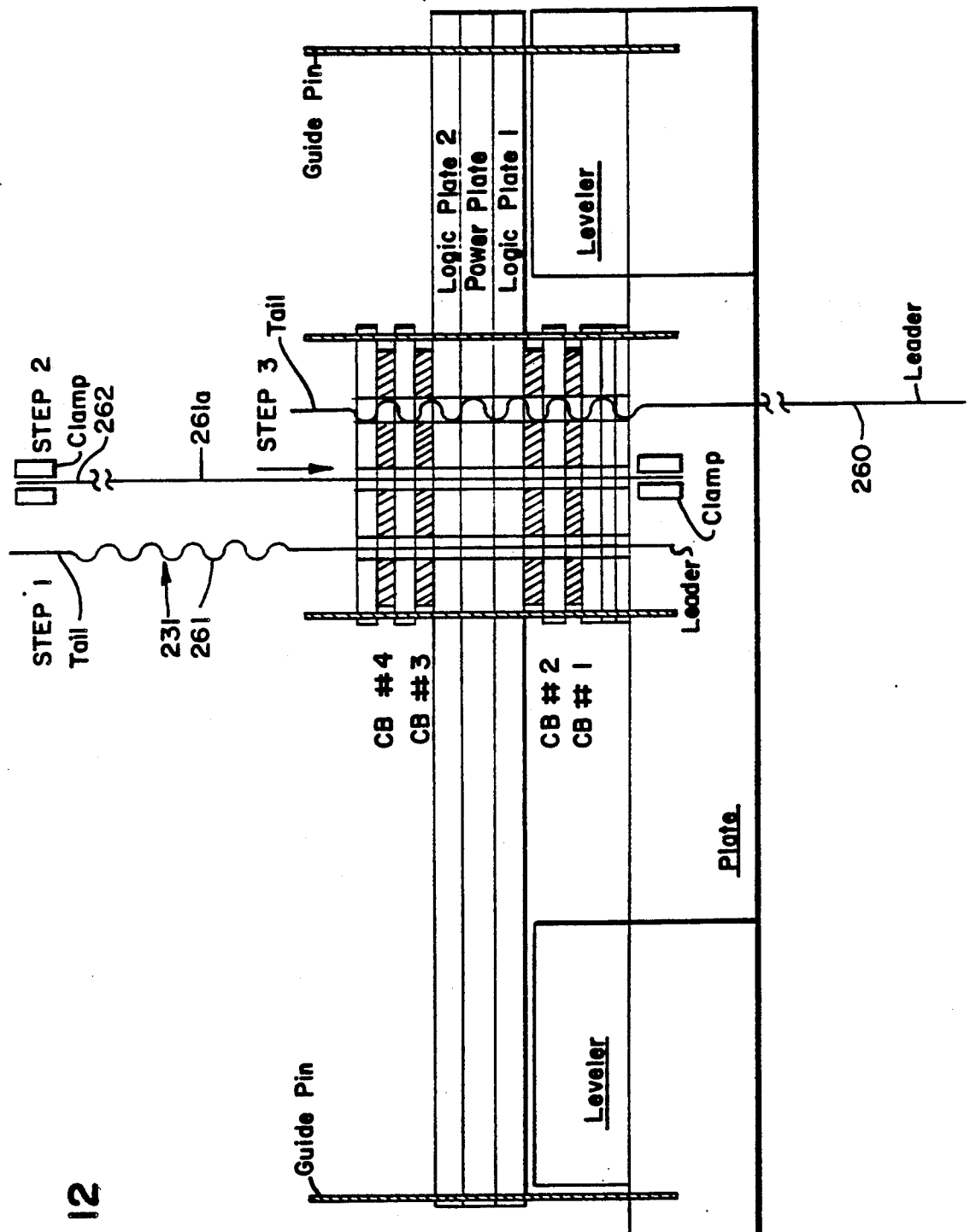
FIG. 12 shows the steps of inserting, stretching, positioning, and releasing the memory metal jumper wires within the axially aligned plated holes of a single stack assembly of PC boards on a module assembly.

As shown in the side view of FIG. 12, the four circuit boards, the power plate and the two logic plates of a module assembly are stacked with guide pins through the corner power jumper holes and corner spacers prior to insertion of the memory metal jumper wires in the preferred embodiment of the present invention. These memory metal wires are in the preferred embodiment 4.2 mils in diameter and 276 mils in length through the kinked portion. To position the kinked memory metal jumpers 231 through the circuit board stack, the leader section 260 of the memory metal jumper is first inserted through the circuit board stack so that the end of the leader section protrudes through the other side. The leader section and the tail section is then grasped or clamped and the tail section 262 is pulled away from the leader section to substantially straighten the kinked portion 261 of the memory metal jumper. The stretching of the memory metal jumper wire causes at least partial stress-induced martensitic transformation of the memory metal (as described more fully below). The leader section 260 is then pulled so that the substantially straightened portion 261a of the kinked memory metal jumper is pulled through and positioned through the stack of circuit boards and positioned within the plated through holes. The tail 262 of the memory metal jumper is then released so that the jumper will reform into its kinked position and so that electrical connections are made within the axially aligned plated through-holes of the stack.

The tail and leader sections may be left extending from the stack so that the stack may be easily disassembled during maintenance. The disassembly could then be accomplished by grasping the tail and leader sections of the memory metal jumper, stretching the jumper until it is substantially straight and withdrawing the jumper from the stack. Alternatively, after insertion, the leader section of the jumper could be snipped off. In this case, during maintenance, the tail end of the jumper could be grasped and the jumper could be dragged from the plated holes, allowing disassembly of the stack. Alternatively, after insertion, both the leader and tail sections could be snipped off flush with the surfaces of the outer circuit boards. In this fashion, a minimum amount of antenna would be protruding from the circuit boards which could potentially cause cross talk or other emission problems. During maintenance disassembly, the outer most circuit boards could be pried away from the stacked circuit module assembly exposing the ends of the memory metal jumpers. One end of the jumper could then be grasped and the jumper could be dragged from its position.

The module power blades 201 are attached to the power plates 210 and added to the partial module assembly using power jumpers 232 in an insertion method similar to the insertion method of jumpers for the individual circuit board stacks. In this case, a kinked memory metal power jumper is inserted in a similar insertion cycle, as described above for the logic jumpers of a single circuit board stack assembly. The module power blades are attached as a last step by inserting memory metal wires into cavities in the machined power blades.

In an alternate preferred embodiment, the kinked memory metal jumper 231 may be inserted in the board stack by dragging the kinked portion through the plated holes. As shown in FIG. 12, the leader section is first inserted into the plated through holes in a Z-axis direction of the board stack. In step 2 a clamp is only applied to the leader section 260. The clamp on the leader section is then used to drag the kinked portion of the memory metal jumper 231 through the board stack. This technique is feasible if damage to the plated through holes is kept to a minimum. This technique does not require pre-stretching of the memory metal jumper wire and thus no stress-induced martensitic transformation takes place (as more fully described below).

In another alternate preferred embodiment, the temperature of the kinked memory metal wire may be lowered below the transition temperature to place the alloy of the wire into the martensitic phase. The wire is then longitudinally stressed substantially straight. While in the martensitic phase, the wire will remain substantially straight after the stress is removed. The wire is then inserted into the axially aligned holes of a plurality of circuit boards. The wire is then warmed or allowed to warm above the transition temperature so that the alloy of the wire enters the austenitic phase. Above the transition temperature, the memory metal wire reestablishes its original kinked shape to effect electrical connection between the circuit boards. Removal of the wires may be accomplished using the techniques described above.

With board stacks having a larger number of levels of circuit boards, logic plates and chips, longer logic jumpers and power jumpers may be used to interconnect along the Z-axis. A concern when using the memory metal jumpers in large numbers on a single stack of circuit boards is that the lateral forces due to the memory metal tension placed on the side walls of the plated holes of the circuit board may sum to create an inordinate amount of stress in a lateral direction substantially parallel to the plain of the surface of the circuit board. This concern is more prevalent when automated insertion of the memory metal jumpers is accomplished due to the inherent repetitive and identical positioning of a plurality of jumpers in a single circuit board stack. If identical positioning and alignment of a plurality of jumpers is accomplished, the stresses in a single direction may sum to force misalignment of the circuit boards from one another. To minimize this problem, the memory metal logic jumpers and power jumpers are inserted at relatively random depths and/or rotations so that the sum tension along any one given direction in a circuit board stack is equivalent to the stresses exerted in any other direction thus, negating any additive effects.

Memory Metal Wire Transformation

Figure 13:
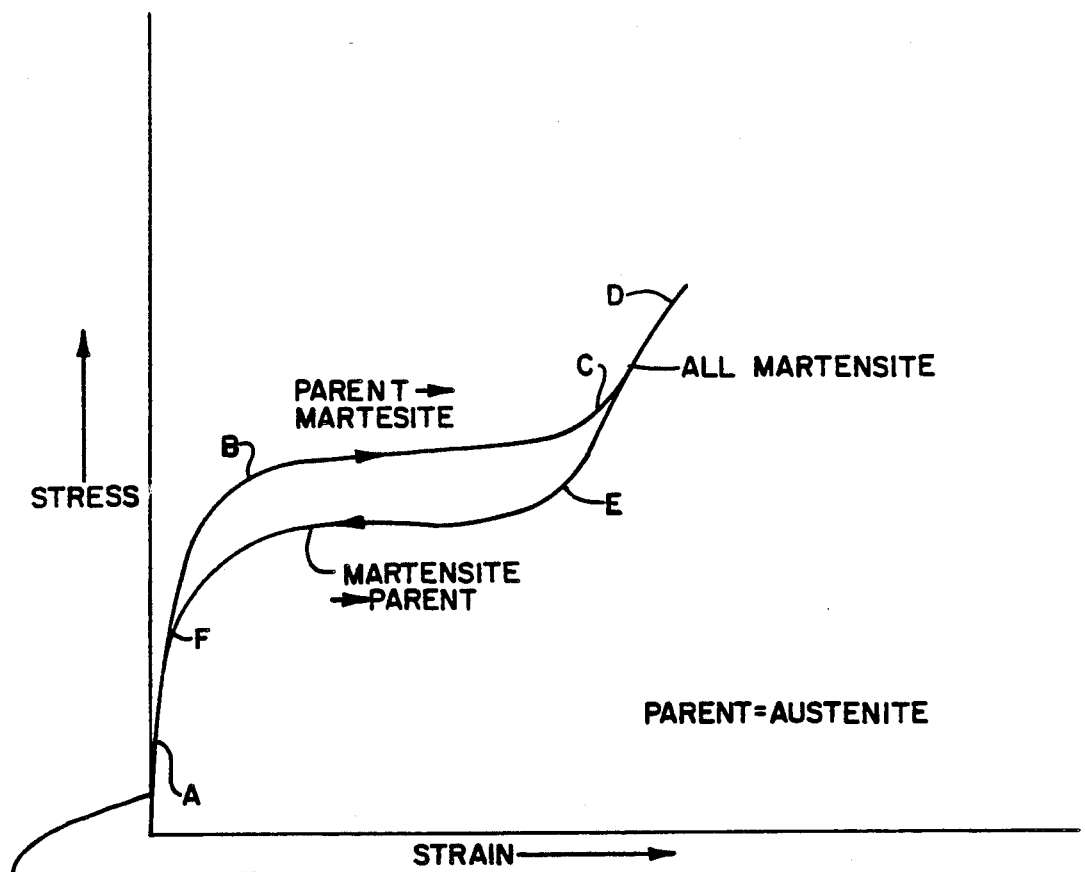
FIG. 13 is a schematic stress-strain curve for memory metal alloys showing the complementary relationship of pseudoelastic and shape-memory behavior.
Figure 14:
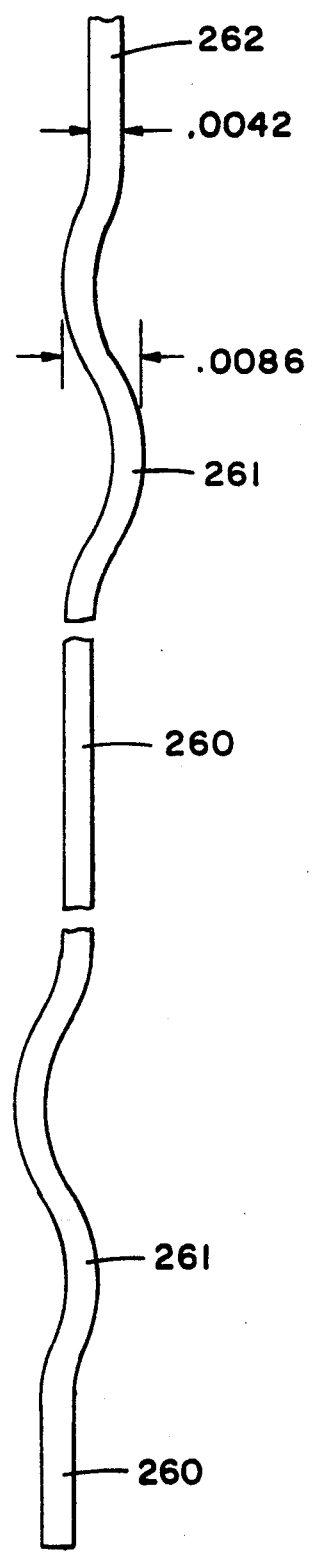
FIG. 14 shows an alternate preferred shape of a memory metal wire.

Kinked memory metal jumper wires prior to insertion exist in an austenitic or parent phase. In the preferred embodiments of the present invention the pseudoelastic behavior is obtained through stress-induced martensitic transformation. Referring to FIG. 13 (taken from the article, "Shape-Memory-Effect Alloys", from the *Encyclopedia of Materials,* and hereby incorporated by reference) a schematic stress-strain curve is shown for memory metal alloys showing the complementary relationship of pseudoelastic and shape-memory behavior. Either cooling the memory metal below the transformation temperature range or application of external stress will cause a martensitic transformation phase change (Parent to Martensite) while heating or unstressing will reverse it (Martensite to Parent). Thus, the pseudoelastic behavior is the mechanical analogue to the athermal (cooling-heating) formation-reversion of martensite. In pseudoelastic behavior, martensitic transformation proceeds as stress increases and reverses with shape recovery when the stress is removed. The shape memory effect and the pseudoelastic behavior of the memory metal are complementary aspects in the deformation and reversion of thermoelastic martensite in any memory metal (shape memory) alloy. When the memory metal is deformed some of the strain is recovered immediately on unloading (pseudoelastic behavior) and the rest on heating (shape-memory effect).

The free state memory metal jumper wire exists in an austenitic parent phase at "A" shown in FIG. 13. As the memory metal jumper wire is stretched, phase transformation to martensite begins at "B". Continued phase transformation from austenite to martensite occurs through increased strain but relatively constant stress until "C", where complete transformation has occurred to martensite. If continued strain is applied, stress increases rapidly above "C" until the 6–10% recoverable strain is exceeded, at which time plastic deformation would occur. In the preferred embodiment of the present invention, the memory metal jumper wires are loaded only to an 8% maximum strain during tensioning prior to board insertion or worst case tolerance loading.

As shown in FIG. 13, there is a slight hysteresis between the austenite to martensite (memory metal jumper wire loading or stretching) and martensite to austenite (memory metal jumper wire unloading or relaxing) transformation ranges, the martensite to austenite transformation occurring at a slightly lower stress level. Unloading of the memory metal jumper wire within the circuit board stack begins along the line from "D" to "E" (all martensite). The relatively constant stress line from "E" to "F" is the martensite to austenite transformation range. The preferred jumper wire design operates in this stress strain range. If the jumper wire were to be unloaded further to its free state, it would proceed from "F" to "A", the all-austenite range. Stress-induced martensitic transformation and associated shape recovery with stress release occurs by shearing parent phase regions to martensite by detwinning within martensite plates and by complementary shrinkage/growth of neighboring martensite plates.

Those of ordinary skill in the art will recognize that other types of memory metals may be used in place of the nickel-titanium alloy described herein. For example, alloys that require heat in order to be straightened out instead of stretching may be used. In addition, the metal wires could have a variety of shapes which would form electrical connections within the plated holes. Finally, the logic jumpers, power jumpers, and power blade connections do not all have to be made from memory metal alloys. For example, the logic jumpers may be memory metal wires as disclosed in the present application and the power jumpers may be soft gold as disclosed in copending application discussed above.

While the present invention has described connection with the preferred embodiment thereof, it will be understood that many modifications will be readily apparent to those of ordinary skill in the art, and this application is intended to cover any adoptions or variations thereof. Therefore, it is manifestly intended that this invention be limited only be the claims and the equivalents thereof.

What is claimed is:

1. An electrical connector for use in forming an electrical connection between through-plated holes of a plurality of electronic circuit assemblies comprising a memory metal wire formed substantially of metal exhibiting a shape-memory effect having a generally linear shape along a longitudinal axis including a plurality of off-axis displacements formed as a continuous part of said wire and adapted for making electrical contact within the through-plated holes.

2. An electrical connector for use in forming an electrical connection between through-plated holes of a plurality of electronic circuit assemblies comprising a memory metal wire formed substantially of metal having a shape-memory effect having a generally linear shape along a longitudinal axis including a plurality of off-axis displacements formed as a continuous part of said wire and adapted for making electrical contact within the through-plated holes, wherein said memory metal wire is comprised of an alloy exhibiting martensitic transformation behavior.

3. The connector according to claim 2 wherein said martensitic transformation behavior is stress-induced.

4. The connector according to claim 2 wherein said martensitic transformation behavior is temperature induced.

5. An electrical connector for use in forming an electrical connection between through-plated holes of a plurality of electronic circuit assemblies comprising a memory metal wire formed substantially of metal having a shape-memory effect having a generally linear shape along a longitudinal axis including a plurality of off-axis displacements formed as a continuous part of said wire and adapted for making electrical contact within the through-plated holes, wherein said memory metal wire is comprised of an alloy exhibiting a pseudoelastic behavior.

6. The connector according to claim 2 wherein said memory metal wire is comprised of an alloy containing at least nickel and titanium.

7. The connector according to claim 5 wherein said memory metal wire is comprised of an alloy containing at least nickel and titanium.

8. The connector according to claim 2 wherein said memory metal wire is comprised of an alloy selected from the group consisting of Ag-Zn, Au-Cd, Au-Cu-Zn, Cu-Al, Cu-Al-Ni, Cu-Au-Zn, Cu-Sn, Cu-Zn, Cu-Zn-Al, Cu-Zn-Ga, Cu-Zn-Si, Cu-Zn-Sn, Fe-Pt, In-Tl, Ni-Al, Ni-Ti, Ni-Ti-X (where X is a ternary element), Ti-Co-Ni, Ti-Cu-Ni, and mixtures thereof.

9. The connector according to claim 5 wherein said memory metal wire is comprised of an alloy selected from the group consisting of Ag-Zn, Au-Cd, Au-Cu-Zn, Cu-Al, Cu-Al-Ni, Cu-Au-Zn, Cu-Sn, Cu-Zn, Cu-Zn-Al, Cu-Zn-Ga, Cu-Zn-Si, Cu-Zn-Sn, Fe-Pt, In-Tl, Ni-Al, Ni-Ti, Ni-Ti-X (where X is a ternary element), Ti-Co-Ni, Ti-Cu-Ni, and mixtures thereof.

10. The connector according to claim 1 wherein said plurality of off-axis displacements are formed in a kinked shape.

11. The connector according to claim 1 wherein said plurality of off-axis displacements are formed in a substantially sinusoidal shape.

12. The connector according to claim 1 wherein said memory metal wire further comprises a substantially straight section along the longitudinal axis followed by a substantially sinusoidal shaped section along the longitudinal axis.

13. The connector according to claim 12 wherein said memory metal wire further comprises alternating sections of substantially straight sections along the longitudinal axis followed by substantially sinusoidal shaped sections along the longitudinal axis.

14. The connector according to claim 2 having a transformation temperature range below 60 degrees Fahrenheit.

15. An electrical connector comprising a plurality of electronic circuit assemblies each having a through-plated hole and an irregularly-shaped memory metal wire formed substantially of metal exhibiting a shape-memory effect having a generally linear shape along a longitudinal axis including a plurality of off-axis displacements formed as a continuous part of said wire and placed within said through-plate hole of each assembly.

16. An electrical connector comprising a plurality of electronic circuit assemblies each having a through-plated hole and an irregularly-shaped memory metal wire formed substantially of metal exhibiting a shape-memory effect having a generally linear shape along a longitudinal axis including a plurality of off-axis displacements formed as a continuous part of said wire and placed within said through-plated hole of each assembly, wherein said irregularly-shaped memory metal wire is comprised of an alloy exhibiting martensitic transformation behavior.

17. The connector according to claim 16 wherein said martensitic transformation behavior is stress-induced.

18. The connector according to claim 16 wherein said martensitic transformation behavior is temperature induced.

19. An electrical connector comprising a plurality of electronic circuit assemblies each having a through-plated hole and an irregularly-shaped memory metal wire formed substantially of metal exhibiting a shape-memory effect having a generally linear shape along a longitudinal axis including a plurality of off-axis displacements formed as a continuous part of said wire and placed within said through-plated hole of each assembly, wherein said shaped memory metal wire is comprised of an alloy exhibiting a pseudoelastic behavior.

20. The connector according to claim 16 wherein said irregularly-shaped memory metal wire is comprised of an alloy containing at least nickel and titanium.

21. The connector according to claim 19 wherein said irregularly-shaped memory metal wire is comprised of an alloy containing at least nickel and titanium.

22. The connector according to claim 16 wherein said irregularly-shaped memory metal wire is comprised of an alloy selected from the group consisting of Ag-Zn, Au-Cd, Au-Cu-Zn, Cu-Al, Cu-Al-Ni, Cu-Au-Zn, Cu-Sn, Cu-Zn, Cu-Zn-Al, Cu-Zn-Ga, Cu-Zn-Si, Cu-Zn-Sn, Fe-Pt, In-Tl, Ni-Al, Ni-Ti, Ni-Ti-X (where X is a ternary element), Ti-Co-Ni, Ti-Cu-Ni, and mixtures thereof.

23. The connector according to claim 19 wherein said irregularly-shaped memory metal wire is comprised of an alloy selected from the group consisting of Ag-Zn, Au-Cd, Au-Cu-Zn, Cu-Al, Cu-Al-Ni, Cu-Au-Zn, Cu-Sn, Cu-Zn, Cu-Zn-Al, Cu-Zn-Ga, Cu-Zn-Si, Cu-Zn-Sn, Fe-Pt, In-Tl, Ni-Al, Ni-Ti, Ni-Ti-X (where X is a ternary element), Ti-Co-Ni, Ti-Cu-Ni, and mixtures thereof.

24. The connector according to claim 15 wherein said irregularly-shaped memory metal wire is formed in a kinked shape.

25. The connector according to claim 15 wherein said irregularly-shaped memory metal wire is formed in a sinusoidal shape.

26. The connector according to claim 15 wherein said irregularly-shaped memory metal wire further comprises a substantially straight section followed by a sinusoidal shaped section.

27. The connector according to claim 16 having a transformation temperature range below 60 degrees Fahrenheit.

28. A method electrically connecting electronic circuit assemblies comprising the steps of:
   (a) axially aligning through-plated holes of two or more circuit boards;
   (b) cooling an irregularly-shaped memory metal wire below its transformation temperature range;
   (c) stretching the memory metal wire linearly to remove the shape;
   (d) inserting the memory metal wire into the through-plated holes; and
   (e) warming memory metal wire such that it regains its shape.

29. A method of electrically connecting two or more circuit boards comprising the steps of:
   (a) manufacturing the circuit boards with plated holes having hole patterns substantially matching and axially aligned;
   (b) positioning the circuit boards so that their planar surfaces are substantially parallel;
   (c) cooling a kinked shape-memory metal wire;
   (d) stretching the kinked shape-memory metal wire so that the wire is substantially straight;
   (e) inserting the memory metal wire into one of the axially aligned through-plated holes of the circuit boards; and
   (f) warming the memory metal wire so that the wire reforms to its kinked shape and so that the wire contacts the interior surfaces of the through-plated holes of the circuit boards and form an electrical connection between the circuit boards.

30. An interconnection apparatus comprising a plurality of circuit boards having at least one through-plated hole on each circuit board and axially aligned with one another; and
   a memory metal wire formed substantially of metal exhibiting a shape-memory effect having a generally linear shape along a longitudinal axis including a plurality of off-axis displacements formed as a continuous part of said wire, and
   said memory metal wire being cooled, being mechanically stretched, being inserted, being released and being warmed within said axially aligned through-plated holes of the circuit boards.

31. An interconnection apparatus comprising a plurality of circuit boards having at least one through-plated hole on each circuit board and axially aligned with one another; and
   a memory metal wire formed substantially of metal exhibiting a shape-memory effect having a generally linear shape along a longitudinal axis including a plurality of off-axis displacements formed as a continuous part of said wire, and
   said memory metal wire being cooled, being mechanically stretched, being inserted, being released and being warmed within said axially aligned through-plated holes of the circuit boards, wherein said memory metal wire is comprised of an alloy exhibiting a temperature-induced martensitic transformation behavior.

32. The apparatus according to claim 31 wherein said memory metal wire is comprised of an alloy containing at least nickel and titanium.

33. An interconnection apparatus comprising a plurality of circuit boards having at least one through-plated hole on each circuit board and axially aligned with one another; and
   a memory metal wire formed substantially of metal exhibiting a shape-memory effect having a generally linear shape along a longitudinal axis including a plurality of off-axis displacements formed as a continuous part of said wire; and
   said memory metal wire being cooled, being mechanically stretched, being inserted, being released and being warmed within said axially aligned through-plated holes of the circuit boards, wherein said memory metal wire is comprised of an alloy exhibiting a pseudoelastic behavior containing at least nickel and titanium.

34. The apparatus according to claim 31 wherein said memory metal wire is comprised of an alloy selected from the group consisting of Ag-Zn, Au-Cd, Au-Cu-Zn, Cu-Al, Cu-Al-Ni, Cu-Au-Zn, Cu-Sn, Cu-Zn, Cu-Zn-Al, Cu-Zn-Ga, Cu-Zn-Si, Cu-Zn-Sn, Fe-Pt, In-Tl, Ni-Al, Ni-Ti, Ni-Ti-X (where X is a ternary element), Ti-Co-Ni, Ti-Cu-Ni, and mixtures thereof.

35. An interconnection apparatus comprising a plurality of circuit boards having at least one through-plated hole on each circuit board and axially aligned with one another; and
   a memory metal wire formed substantially of metal exhibiting a shape-memory effect having a generally linear shape along a longitudinal axis including a plurality of off-axis displacements formed as a continuous part of said wire; and
   said memory metal wire being cooled, being mechanically stretched, being inserted, being released and being warmed within said axially aligned through-plated holes of the circuit boards, wherein said memory metal wire is comprised an alloy exhibiting a pseudoelastic behavior selected from the group consisting of Ag-Zn, Au-Cd, Au-Cu-Zn, Cu-Al, Cu-Al-Ni, Cu-Au-Zn, Cu-Sn, Cu-Zn, Cu-Zn-Al, Cu-Zn-Ga, Cu-Zn-Si, Cu-Zn-Sn, Fe-Pt, In-Tl, Ni-Al, Ni-Ti, Ni-Ti-X (where X is a ternary element), Ti-Co-Ni, Ti-Cu-Ni, and mixtures thereof.

36. The apparatus according to claim 30 wherein said memory metal wire is formed in a kinked shape.

37. The apparatus according to claim 30 wherein said memory metal wire is formed in a sinusoidal shape.

38. The apparatus according to claim 30 wherein said memory metal wire further comprises a substantially straight section followed by a sinusoidal shaped section.

39. The apparatus according to claim 31 having a transformation temperature range below 60 degrees Fahrenheit.

40. A method of electrically connecting an interconnection apparatus, said apparatus comprising:
a plurality of circuit boards having at least one through-plated hole on each circuit board and axially aligned with one another; and
an irregularly-shaped memory metal wire having a generally linear shape along a longitudinal axis including a plurality of off-axis displacements formed as a continuous part of said wire mechanically inserted within said axially aligned through-plated holes of the circuit boards;
said method comprising the steps of:
(a) cooling the memory metal wire;
(b) inserting a leader section of the memory metal wire into the axially aligned through-plated holes of the circuit boards;
(c) stretching the memory metal wire so that the wire is substantially straightened and the shape is removed;
(d) further inserting the memory metal wire into the axially aligned through-plated holes of the circuit boards; and
(e) warming the memory metal wire so that the wire substantially regains its shape and contacts the interior surfaces of the through-plated holes and forms an electrical connection between the circuit boards.

41. The apparatus according to claim 40 wherein said irregularly-shaped memory metal wire is comprised of an alloy exhibiting a temperature-induced martensitic transformation behavior.

42. The apparatus according to claim 41 wherein said irregularly-shaped memory metal wire is comprised of an alloy containing at least nickel and titanium.

43. The apparatus according to claim 40 wherein said irregularly-shaped memory metal wire is comprised of an alloy exhibiting a pseudoelastic behavior containing at least nickel and titanium.

44. The apparatus according to claim 41 wherein said irregularly-shaped memory metal wire is comprised of an alloy selected from the group consisting of Ag-Zn, Au-Cd, Au-Cu-Zn, Cu-Al, Cu-Al-Ni, Cu-Au-Zn, Cu-Sn, Cu-Zn, Cu-Zn-Al, Cu-Zn-Ga, Cu-Zn-Si, Cu-Zn-Sn, Fe-Pt, In-Tl, Ni-Al, Ni-Ti, Ni-Ti-X (where X is a ternary element), Ti-Co-Ni, Ti-Cu-Ni, and mixtures thereof.

45. The apparatus according to claim 40 wherein said irregularly-shaped memory metal wire is comprised of an alloy exhibiting a pseudoelastic behavior selected from the group consisting of Ag-Zn, Au-Cd, Au-Cu-Zn, Cu-Al, Cu-Al-Ni, Cu-Au-Zn, Cu-Sn, Cu-Zn, Cu-Zn-Al, Cu-Zn-Ga, Cu-Zn-Si, Cu-Zn-Sn, Fe-Pt, In-Tl, Ni-Al, Ni-Ti, Ni-Ti-X (where X is a ternary element), Ti-Co-Ni, Ti-Cu-Ni, and mixtures thereof.

46. The apparatus according to claim 40 wherein said irregularly-shaped memory metal wire is formed in a kinked shape.

47. The apparatus according to claim 40 wherein said irregularly-shaped memory metal wire is formed in a sinusoidal shape.

48. The apparatus according to claim 40 wherein said irregularly-shaped memory metal wire further comprises a substantially straight section followed by a substantially sinusoidal shaped section.

49. The apparatus according to claim 41 having a transformation temperature range below 60 degrees Fahrenheit.

50. A method of electrically connecting an interconnection apparatus between a plurality of circuit boards having at least one through-plated hole on each circuit board and axially aligned with one another; said apparatus comprising:
an irregularly-shaped memory metal wire mechanically inserted within said axially aligned through-plated holes of the circuit boards;
said method comprising the steps of:
(a) axially aligning the through-plated holes of the circuit boards;
(b) cooling the irregularly-shaped memory metal wire below its transformation temperature range;
(c) stretching the memory metal wire linearly to remove the shape;
(d) inserting the memory metal wire into the through-plated holes; and
(e) warming the memory metal wire such that it regains its shape.

51. The apparatus according to claim 50 wherein said irregularly-shaped memory metal wire is comprised of an alloy exhibiting a temperature-induced martensitic transformation behavior.

52. The apparatus according to claim 51 wherein said irregularly-shaped memory metal wire is comprised of an alloy containing at least nickel and titanium.

53. The apparatus according to claim 50 wherein said irregularly-shaped memory metal wire is comprised of an alloy exhibiting a pseudoelastic behavior containing at least nickel and titanium.

54. The apparatus according to claim 51 wherein said irregularly-shaped memory metal wire is comprised of an alloy selected from the group consisting of Ag-Zn, Au-Cd, Au-Cu-Zn, Cu-Al, Cu-Al-Ni, Cu-Au-Zn, Cu-Sn, Cu-Zn, Cu-Zn-Al, Cu-Zn-Ga, Cu-Zn-Si, Cu-Zn-Sn, Fe-Pt, In-Tl, Ni-Al, Ni-Ti, Ni-Ti-X (where X is a ternary element), Ti-Co-Ni, Ti-Cu-Ni, and mixtures thereof.

55. The apparatus according to claim 50 wherein said irregularly-shaped memory metal wire is comprised of an alloy exhibiting a pseudoelastic behavior selected from the group consisting of Ag-Zn, Au-Cd, Au-Cu-Zn, Cu-Al, Cu-Al-Ni, Cu-Au-Zn, Cu-Sn, Cu-Zn, Cu-Zn-Al, Cu-Zn-Ga, Gu-Zn-Si, Cu-Zn-Sn, Fe-Pt, In-Tl, Ni-Al, Ni-Ti, Ni-Ti-X (where X is a ternary element), Ti-Co-Ni, Ti-Cu-Ni, and mixtures thereof.

56. The apparatus according to claim 50 wherein said irregularly-shaped memory metal wire is formed in a kinked shape.

57. The apparatus according to claim 50 wherein said irregularly-shaped memory metal wire is formed in a sinusoidal shape.

58. The apparatus according to claim 50 wherein said irregularly-shaped memory metal wire further comprises a substantially straight section followed by a substantially sinusoidal shaped section.

59. The apparatus according to claim 51 having a transformation temperature range below 60 degrees Fahrenheit.

* * * * *

UNITED STATES PATENT AND TRADEMARK OFFICE
CERTIFICATE OF CORRECTION

PATENT NO. : 5,098,305
DATED : March 24, 1992
INVENTOR(S) : Nicholas J. Krajewski et al.

It is certified that error appears in the above-indentified patent and that said Letters Patent is hereby corrected as shown below:

Col. 4, lines 16 and 21, after "cross-sectional" insert --view--.

Col. 4, line 46, after "way" insert --of--.

Col. 6, line 6, after the words "(not shown)" insert --,--.

Col. 6, line 29, after the word "to" insert --the--.

Col. 6, line 44, delete "chip" and insert --chips-- therefor.

Col. 7, line 29, after the word "such" insert --as--.

Col. 8, line 25, after the words "(not shown)" insert --,--.

Col. 8, line 31, delete "is" and insert --are- therefor.

Col. 14, line 16, delete "thorough" and insert --through-- therefor.

Col. 14, line 37, delete "connection" and insert --connections-- therefor.

UNITED STATES PATENT AND TRADEMARK OFFICE
CERTIFICATE OF CORRECTION

PATENT NO. : 5,098,305
DATED : March 24, 1992
INVENTOR(S) : Nicholas J. Krajewski et al.

It is certified that error appears in the above-indentified patent and that said Letters Patent is hereby corrected as shown below:

Col. 15, line 14, after the word "long" insert the word --as--.

Col. 16, line 4, delete the word "on" and insert --of-- therefor.

Col. 19, line 20, delete the word "be" and insert --by-- therefor.

Col. 24, line 53, claim 53, delete "Gu-Zn-Si" and insert --Cu-Zn-Si-- therefor.

Signed and Sealed this

Third Day of August, 1993

Attest:

MICHAEL K. KIRK

Attesting Officer

Acting Commissioner of Patents and Trademarks